(12) United States Patent
Hosoki

(10) Patent No.: US 11,156,872 B2
(45) Date of Patent: Oct. 26, 2021

(54) DISPLAY DEVICE INCLUDING HEATSINK

(71) Applicant: SHARP KABUSHIKI KAISHA, Sakai (JP)

(72) Inventor: Mitsuru Hosoki, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 0 days.

(21) Appl. No.: 17/146,879

(22) Filed: Jan. 12, 2021

(65) Prior Publication Data

US 2021/0263381 A1 Aug. 26, 2021

Related U.S. Application Data

(60) Provisional application No. 62/979,085, filed on Feb. 20, 2020, provisional application No. 62/979,089, filed on Feb. 20, 2020.

(51) Int. Cl.
G02F 1/1335 (2006.01)
H05K 7/20 (2006.01)
G02F 1/13357 (2006.01)

(52) U.S. Cl.
CPC .. *G02F 1/133628* (2021.01); *G02F 1/133615* (2013.01); *H05K 7/20963* (2013.01); *G02F 2203/01* (2013.01)

(58) Field of Classification Search
CPC ............ B01D 53/261; B01D 2253/112; B01D 2253/106; B01D 2253/116; B01D 2253/11; F21V 15/01; F21V 31/03; F21V 31/00; F21Y 2115/10
See application file for complete search history.

(56) References Cited

FOREIGN PATENT DOCUMENTS

| CN | 200993712 Y | * | 12/2007 | |
| CN | 100523934 C | * | 8/2009 | ....... G02F 1/133603 |
| CN | 208506447 U | * | 2/2019 | |
| JP | 2007-047274 A | | 2/2007 | |

* cited by examiner

*Primary Examiner* — Rajarshi Chakraborty
*Assistant Examiner* — Glenn D Zimmerman
(74) *Attorney, Agent, or Firm* — ScienBiziP, P.C.

(57) ABSTRACT

A display device includes a display panel, a light source, and a heatsink. The display panel is disposed in a vertical position. The display panel includes a display surface on which an image is displayed. The light source illuminates the display panel and an object disposed behind the display panel. The heatsink dissipates heat produced by the light source. The a heatsink includes a light source disposed portion on which the light source is disposed and a heat dissipating portion disposed farther from a front of the display device relative to the light source disposed portions in a thickness direction of the display panel. The heat dissipating portion includes fins having plate shapes and being arranged in the thickness direction of the display panel.

19 Claims, 30 Drawing Sheets

DISPLAY DEVICE INCLUDING HEATSINK

CROSS REFERENCE TO RELATED APPLICATION

This application claims priority from U.S. provisional patent applications Nos. 62/979,085 and 62/979,089 filed on Feb. 20, 2020. The entire contents of the priority application are incorporated herein by reference.

TECHNICAL FIELD

The technology described herein relates to a display device including a heatsink.

BACKGROUND

A see-through display, which is an example of uses of a display device, has been known. In the see-through display, an object (e.g., an exhibit) is disposed in a field of view of a user and an image (e.g., information on the exhibit) is displayed to be superimposed over the object.

The display device includes a light emitting glass as a light emitting element and a liquid crystal panel as a light shutter. The light emitting glass includes a fluorescent metal component that emits light when excited by ultraviolet rays. The fluorescent metal component is sealed in a glass. By adjusting an amount of the ultraviolet rays entering the light emitting glass with the light shutter, a specific portion of the display device emitting light is displayed. Because the display device is transparent, the display device can be used as a see-through display.

The display device has less versatility because an increase in size of the display device is difficult and leakage of the ultraviolet rays, which are hazardous, to the outside may occur. To resolve such a problem, a combination of general light sources (e.g., LEDs) and a general display panel (e.g., a liquid crystal panel) may be used for a see-through display. Specifically, the LEDs may be disposed to surround the liquid crystal panel to illuminate the liquid crystal panel an exhibit disposed behind the liquid crystal panel. According to the configuration, an image on the liquid crystal panel and the exhibit are superimposed and viewed. However, outputs of the LEDs need to be increased to illuminate the liquid crystal panel and the exhibit with high intensity at the same time. Namely, a lager heatsink, which is a heat dissipation member, is required. This may increase a frame width of the display device in which the heatsink is disposed.

SUMMARY

The technology described herein was made in view of the above circumstances. An object is to provide a see-through display having a smaller frame width and higher versatility.

A display device includes a display panel, a light source, and a heatsink. The display panel is disposed in a vertical position in a direction crossing a horizontal direction. The display panel displays an image. the light source illuminates the display panel and a subject to be illuminated disposed on an opposite side from a display surface of the display panel. The light source is disposed on the heatsink to dissipate heat produced by the light source. The heatsink includes at least one of an upper heatsink disposed on an upper side of the display panel to extend in a right-left direction and side heatsinks disposed on right and left sides of the display panel to extend in a top-bottom direction. The at least one of the upper heatsink and the side heatsinks includes a light source disposed portion and a heat dissipating portion. The light source disposed portion includes a first sloped surface at a redetermined angle relative to the display surface to face the subject to be illuminated. The light source is disposed on the first sloped surface. The heat dissipating portion is disposed on an opposite side from the display surface relative to the light source disposed portion to a thickness direction of the display panel. The heat dissipating portion includes fins having plate shapes. The fins are arranged in the thickness direction of the display panel.

According to the technology described herein, a see-through display having a smaller frame width and higher versatility is provided.

DETAILED DESCRIPTION

First Embodiment

Figure 1:
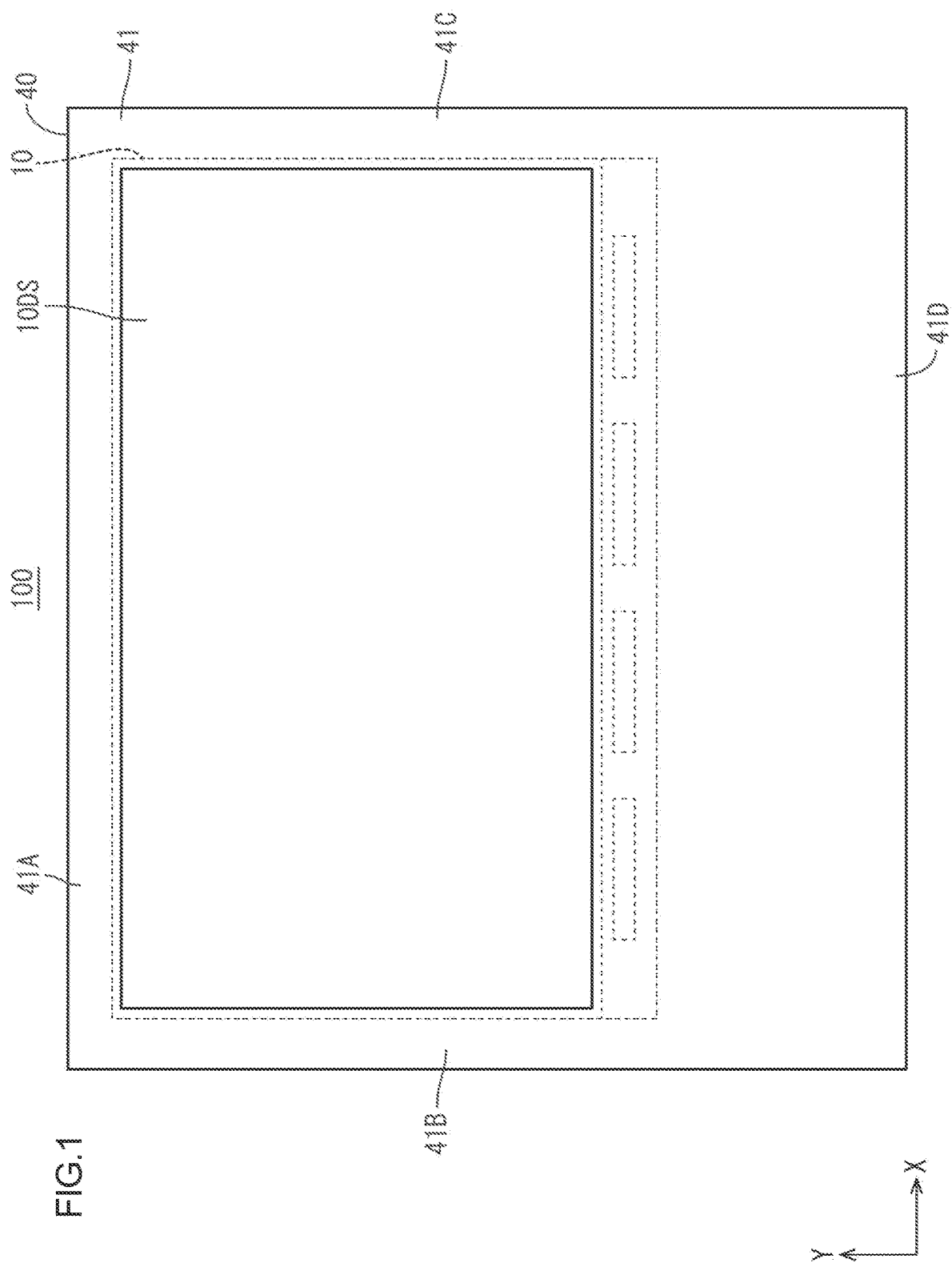
FIG. 1 is a front view of a liquid crystal display device.

A liquid crystal display device 100 (an example of a display device) according to a first embodiment will be described with reference to FIGS. 1 to 11. X-axes, Y-axes, and Z-axes may be present in the drawings. The axes in each drawing indicate directions that correspond to directions indicated by the respective axes in other drawings. The X-axes, the Y-axes, and the Z-axes indicate the right-left direction, the top-bottom direction, and the front-rear direction, respectively. A tip of the Z arrow (on+ side of the Z-axis) indicates the front side and an end of the Z arrow (on− side of the Z-axis) indicates the rear side (the back side).

As illustrated in FIG. 1, the liquid crystal display device 100 has a horizontally-long rectangular overall shape and includes a liquid crystal panel 10 (an example of a display panel) housed in a case 40 (an example of a frame). The liquid crystal display device 100 is used as a see-through display that is configured to display images superimposed over an object J. Examples of the object J include exhibits and products. Examples of the images include information on the exhibits or the products and accessory images to decorate the object J. The liquid crystal panel 10 has transparency and thus an image displayed on the liquid crystal panel 10 is superimposed over the object J that is disposed behind the liquid crystal panel 10 (see FIG. 7) and viewed through the liquid crystal panel 10. The liquid crystal panel 10 has a mid to large screen size (about 60 inches to 90 inches).

Figure 2:
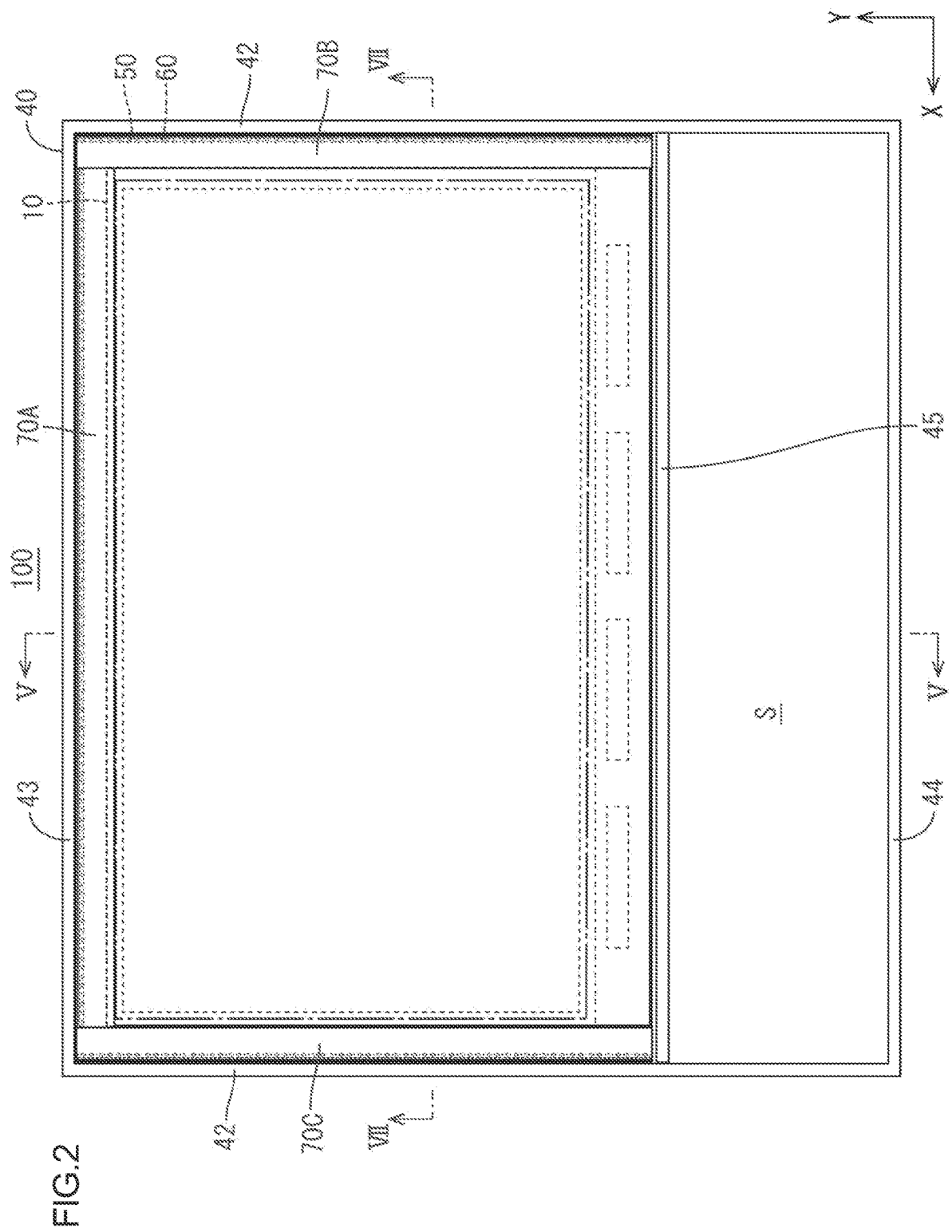
FIG. 2 is a rear view of the liquid crystal display device.

As illustrated in FIGS. 1 and 2, the liquid crystal display device 100 includes the liquid crystal panel 10, the case 40 (an example of the frame), LEDs 50 (an example of light sources), LED boards 60 (an example of a light source board), and three heatsinks 70A, 70B, and 70C. The case 40 holds the liquid crystal panel 10 therein. The case 40 has an opening on the front side to overlap a display area (an active area) AA of the liquid crystal panel 10.

Figure 3:
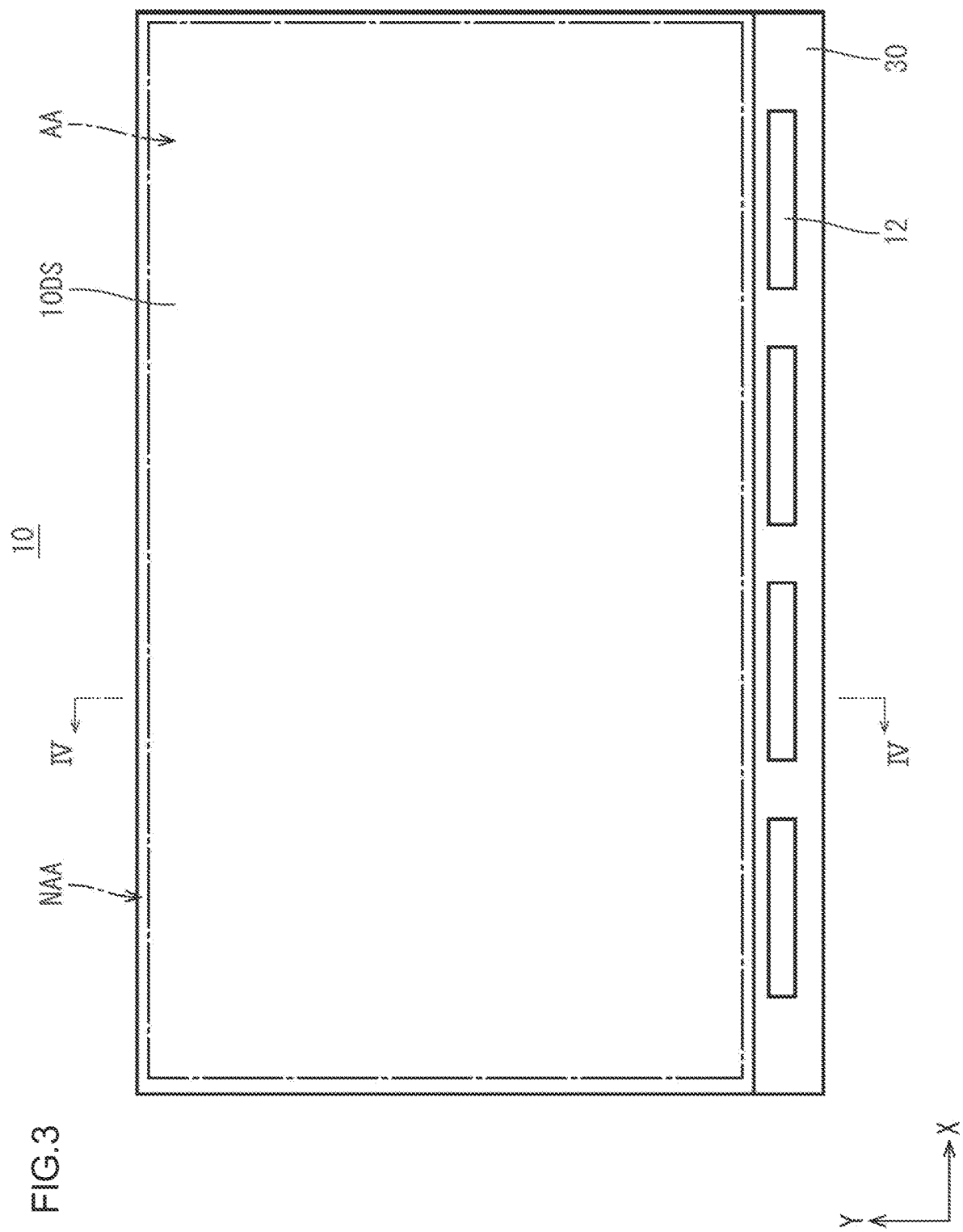
FIG. 3 is a plan view of a liquid crystal panel.

As illustrated in FIG. 1, the liquid crystal panel 10 is held in the case 40 such that a display surface 10DS on which images are displayed is on the front side. As illustrated in FIG. 3, the liquid crystal panel 10 has a horizontally-long rectangular overall shape. The liquid crystal panel 10 includes a surface that is divided into a display area AA and a non-display area (non-active area) NAA. The display area AA is located on an inner side of the surface to display images. The non-display area NAA is located on an outer side of the surface to surround the display area AA. The non-display area NAA has a frame shape (a picture frame shape) when viewed from the front side. A driver 12 is disposed in the non-display area NAA to drive the liquid crystal panel 10. The driver 12 receives various signals from a control circuit board.

Figure 4:
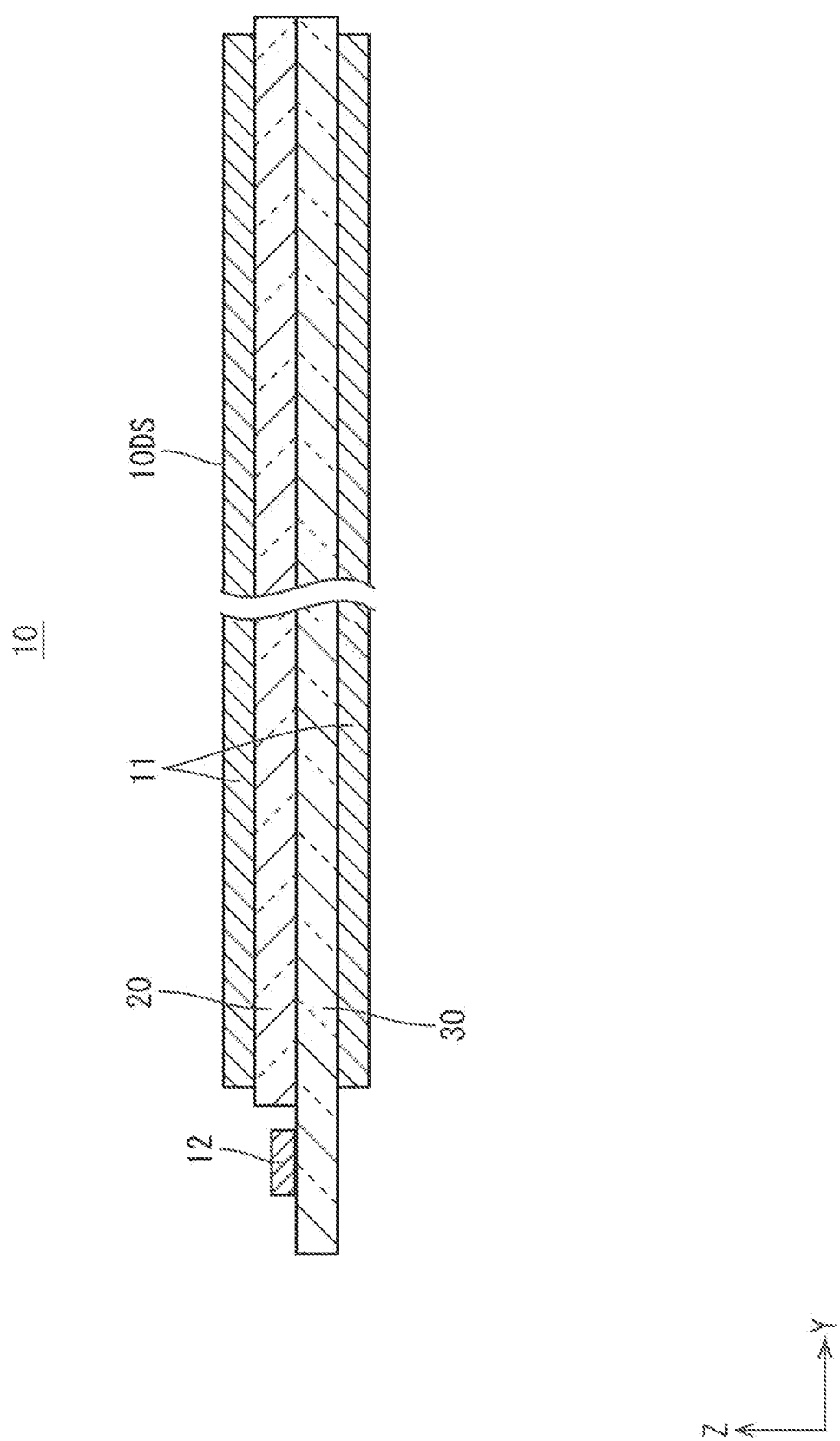
FIG. 4 is a cross-sectional view along line IV-IV in FIG. 3.

As illustrated in FIG. 4, the liquid crystal panel includes substantially transparent substrates 20 and 30 bonded to each other with a predefined gap. Liquid crystals are sealed between the substrates 20 and 30. A color filter and an alignment film are disposed on the substrate 20 on the front side. The color filter includes red (R), green (G), and blue (B) color portions arranged in a predefined pattern. Switching components (e.g., TFTs), pixel electrodes, and an alignment film are disposed on the substrate 30 on the rear side. The switching components are connected to source lines and gate lines that are perpendicular to each other. The pixel electrodes are connected to the switching components. Polarizing plates 11 are disposed on the substrates 20 and 30, respectively.

Figure 5:
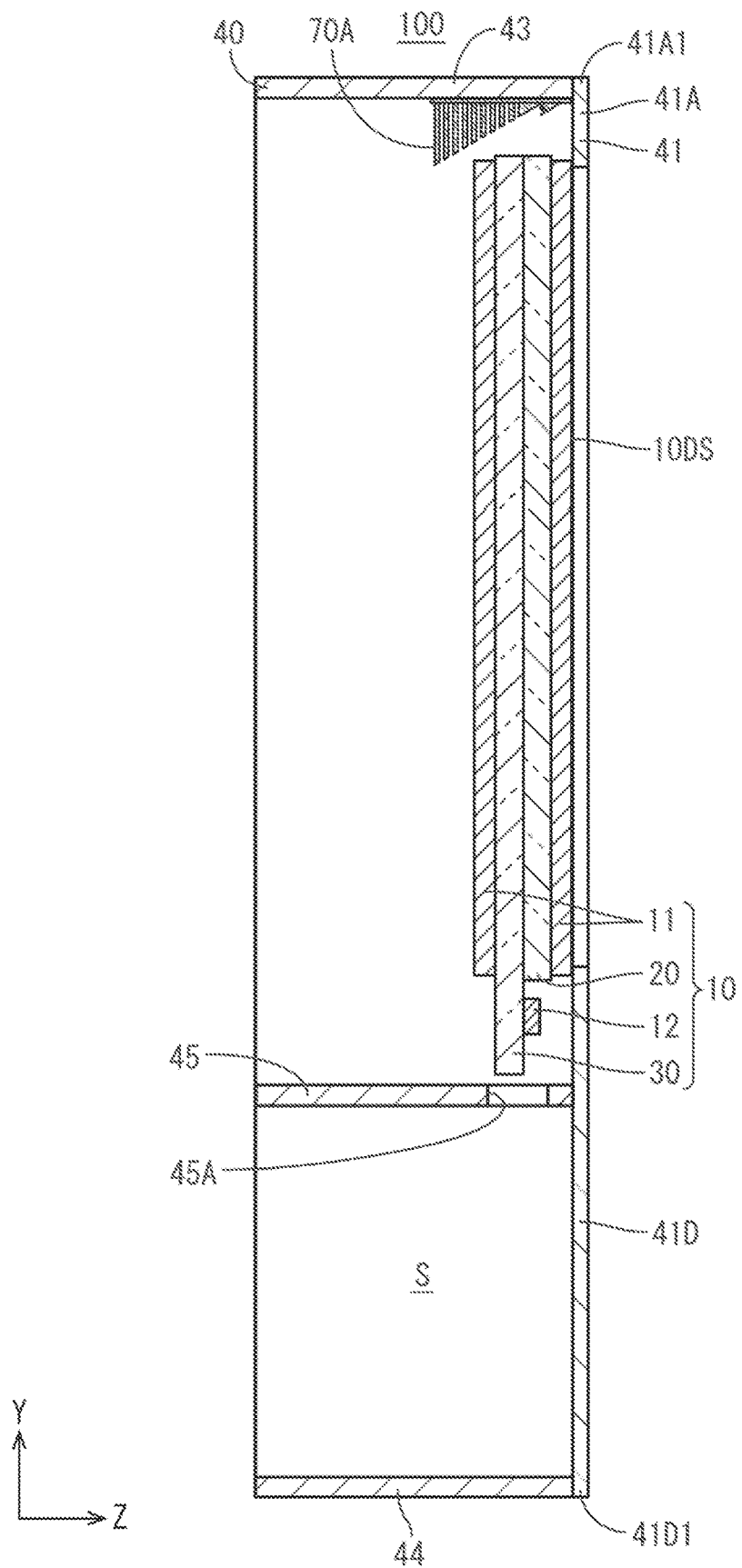
FIG. 5 is a cross-sectional view along line V-V in FIG. 2.

The case 40 is made of wood. As illustrated in FIGS. 1, 2 and 5, the case 40 holds the liquid crystal panel 10 therein with the liquid crystal panel 10 in a vertical position (in the Y-axis direction, an example of a direction perpendicular to the horizontal direction). The case 40 includes a frame portion 41, extending portions (specifically, two side boards 42, a top board 43, and a bottom board 44), and a shelf board 45. The extending portions extend rearward from outer edges of the frame portion. The frame portion 41 is a frame-shaped board that surrounds the display area AA of the liquid crystal panel 10. The frame portion 41 includes an upper frame section 41A, a left frame section 41B, a right frame section 41C, and a lower frame section 41D that define four edges of an opening that overlaps the display area AA. The lower frame section 41D has a width greater than a width of the upper frame section 41A. As illustrated in FIG. 5, a space S is provided behind the lower frame section 41D (under the liquid crystal panel 10) for holding external devices (such as a computer) therein.

Figure 7:
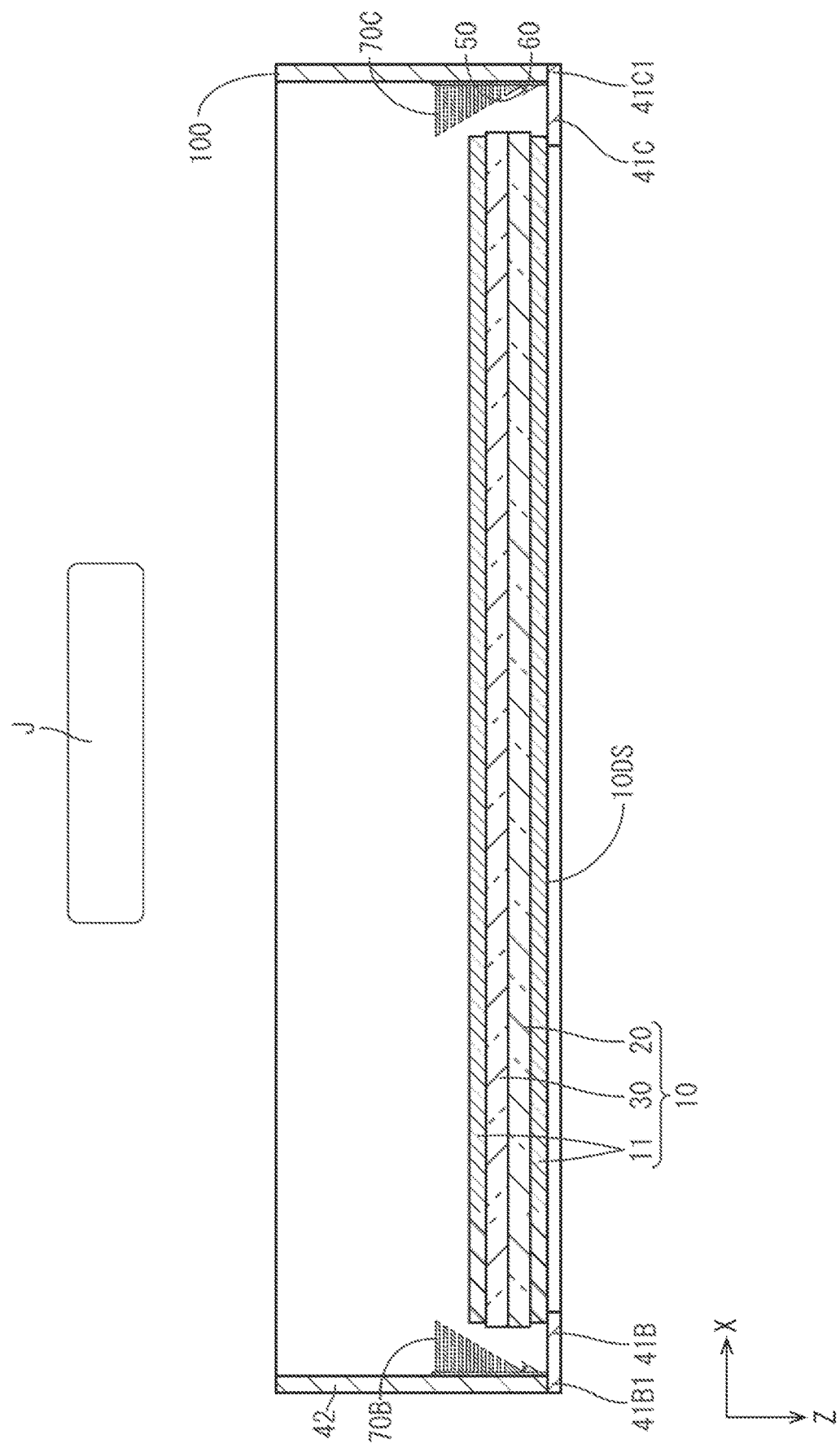
FIG. 7 is a cross-sectional view along line VII-VII in FIG. 2.

As illustrated in FIG. 5, the top board 43 extends rearward from an upper edge 41A1 of the upper frame section 41A in a thickness direction of the liquid crystal panel 10 (in the Z-axis direction). The top board 43 connects an upper edge of one of the side boards 42 to an upper edge of the other. The bottom board 44 extends rearward from a lower edge 41D1 of the lower frame section 41D in the Z-axis direction. The bottom board 44 connects a lower edge of one of the side boards 42 to a lower edge of the other. The shelf board 45 extends rearward from a back surface of the lower frame section 41D in the Z-axis direction. The shelf board 45 includes a through hole 45A that is drilled through the shelf board 45 in the vertical direction. A cable may be passed through the through hole and connected to the liquid crystal panel 10. As illustrated in FIG. 7, the side boards 42 extend rearward from a left edge 41B1 of the left frame section 41B and a right edge 41C1 of the right frame section 41C in the Z-axis direction, respectively.

As illustrated in FIG. 2, three heatsinks 70A, 70B, and 70C having elongated shapes are disposed behind the upper frame section 41A, the left frame section 41B, and the right frame section 41C. The heatsinks 70A, 70B, and 70C are referred to as the upper heatsink 70A, the left heatsink 70B, and the right heatsink 70C based on the locations. The upper heatsink 70A is disposed on an upper side of the liquid crystal panel 10 (behind the upper frame section 41A) to extend in the right-left direction (the X-axis direction). The left heatsink 70B and the right heatsink 70C (side heatsinks 70B and 70C) are disposed on the left side and the right side of the liquid crystal panel 10 (behind the left frame section 41B and the right frame section 41C) to extend in the top-bottom direction (the Y-axis direction).

Figure 6:
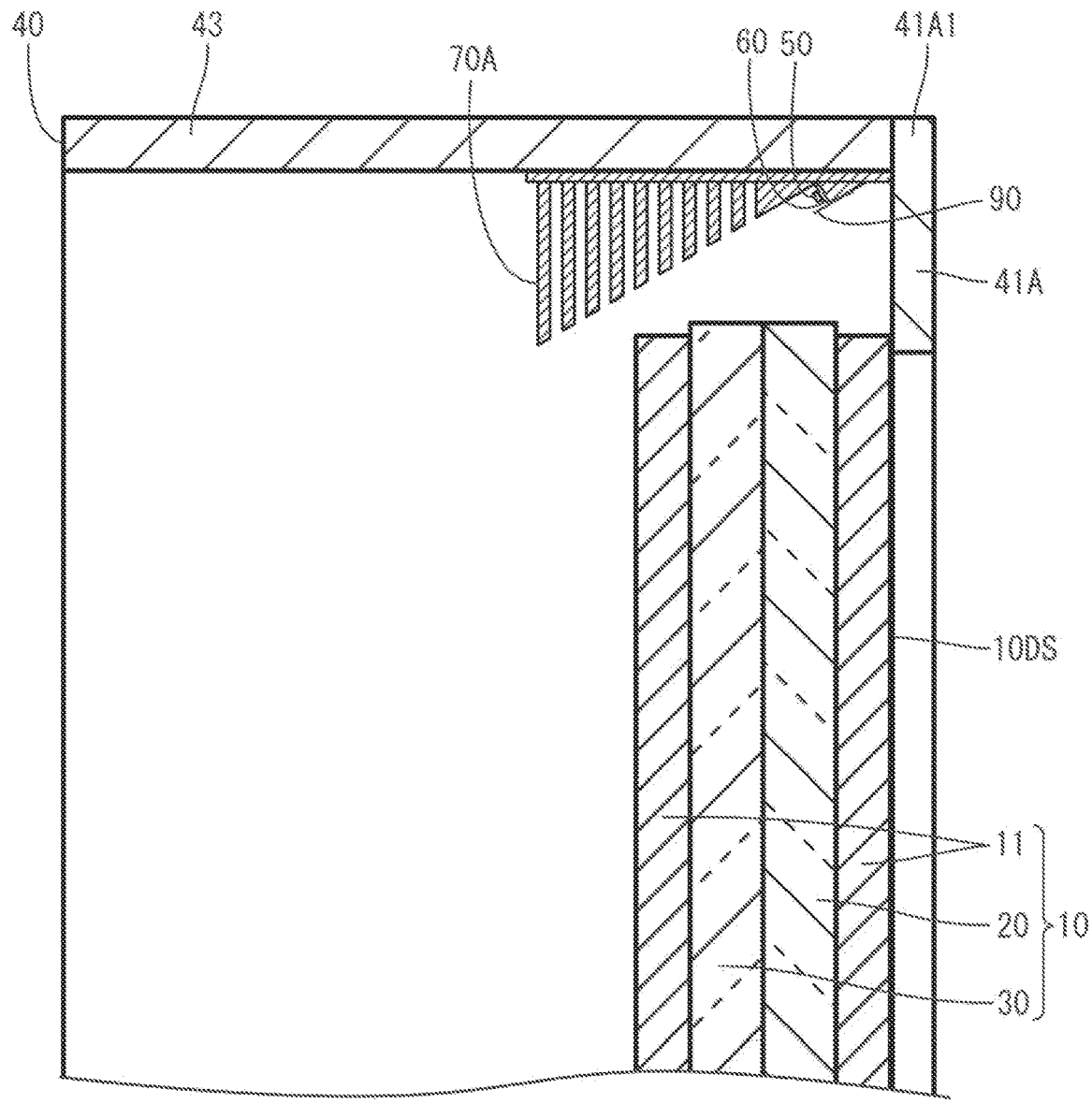
FIG. 6 is a magnified partial view of FIG. 5.
Figure 8:
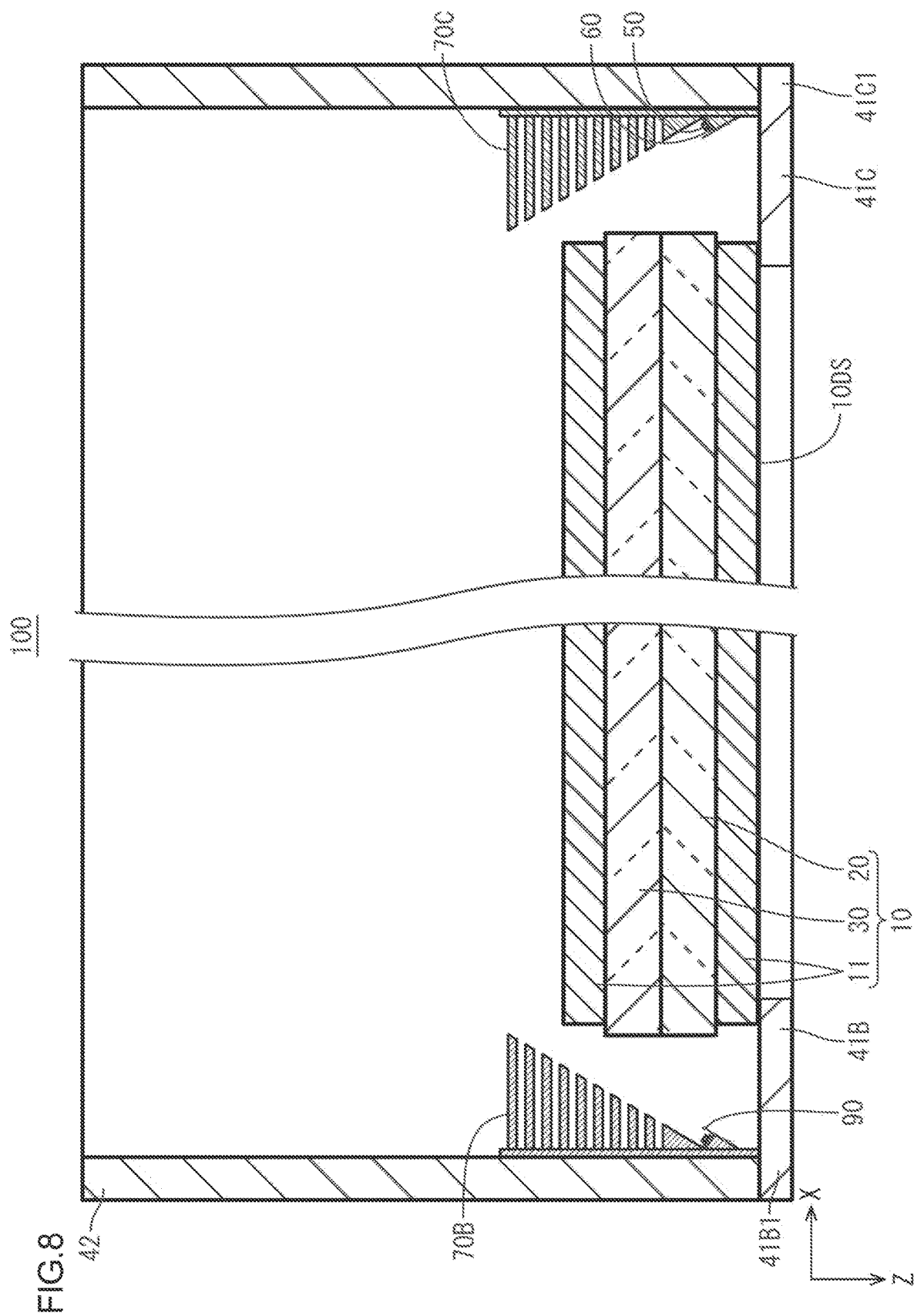
FIG. 8 is a magnified view of FIG. 7.

As illustrated in FIG. 2, the LEDs 50 are disposed on each of the heatsinks 70A, 70B, and 70C. The LEDs 50 are disposed to illuminate the liquid crystal panel 10 and the object J (the subject to be illuminated) disposed behind the liquid crystal panel 10. The heatsinks 70A, 70B, and 70C dissipate heat produced by the LEDs 50. As illustrated in FIGS. 5 and 6, the upper heatsink 70A is disposed behind the upper frame section 41A and attached to the top board 43. As illustrated in FIGS. 7 and 8, the left heatsink 70B is disposed behind the left frame section 41B and attached to the left side board 42. The right heatsink 70C is disposed behind the right frame section 41C and attached to the right side board 42. Each of the heatsinks 70A, 70B, and 70C is made of aluminum and includes portions that are integrally formed by extrusion molding. A dimension of each of the heatsinks 70A, 70B, and 70C in a longitudinal direction is easily adjustable according to a size of the liquid crystal panel 10 by adjusting a pushing distance in the production.

Figure 9:
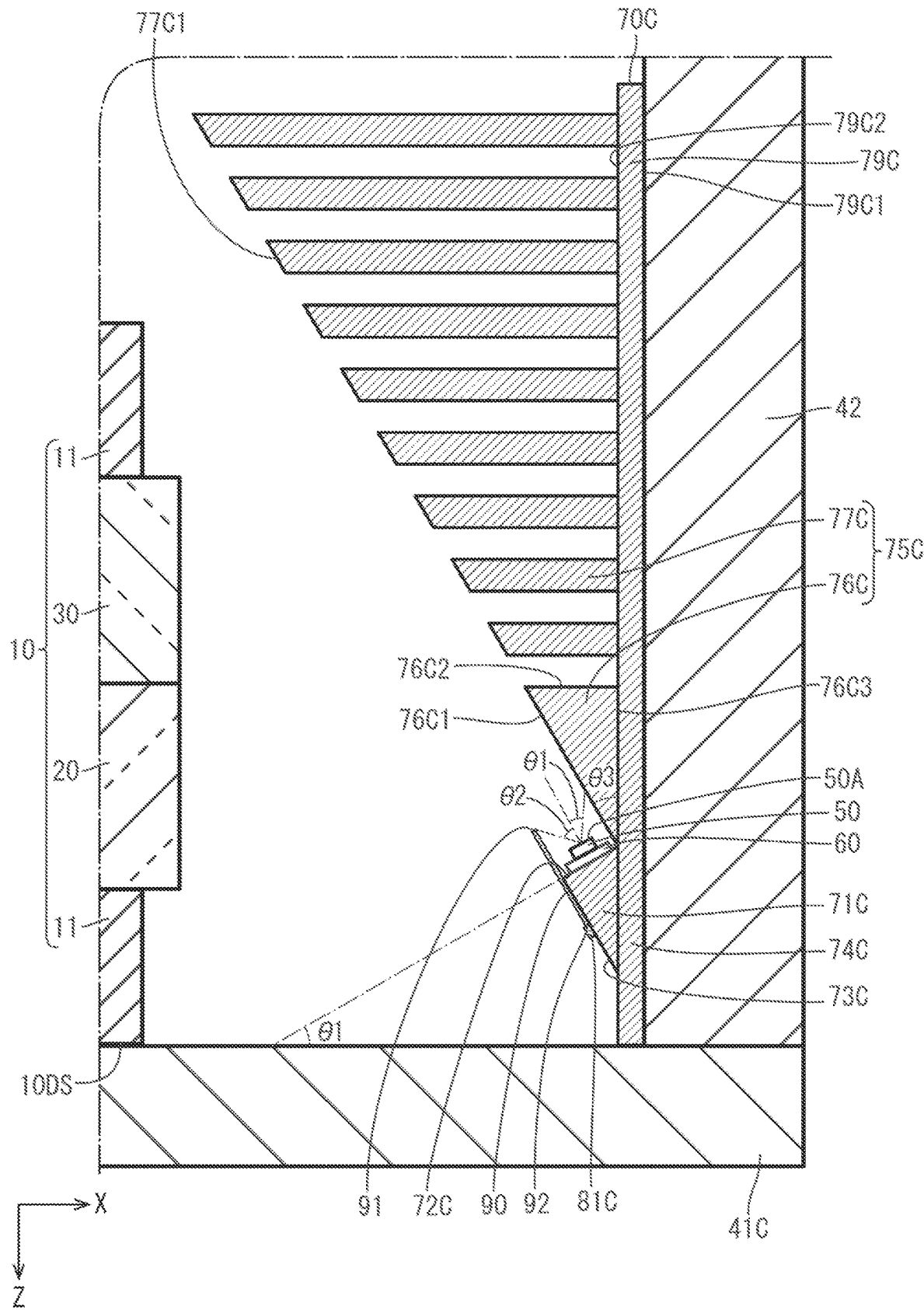
FIG. 9 is a magnified cross-sectional view including a right heatsink and therearound.
Figure 10:
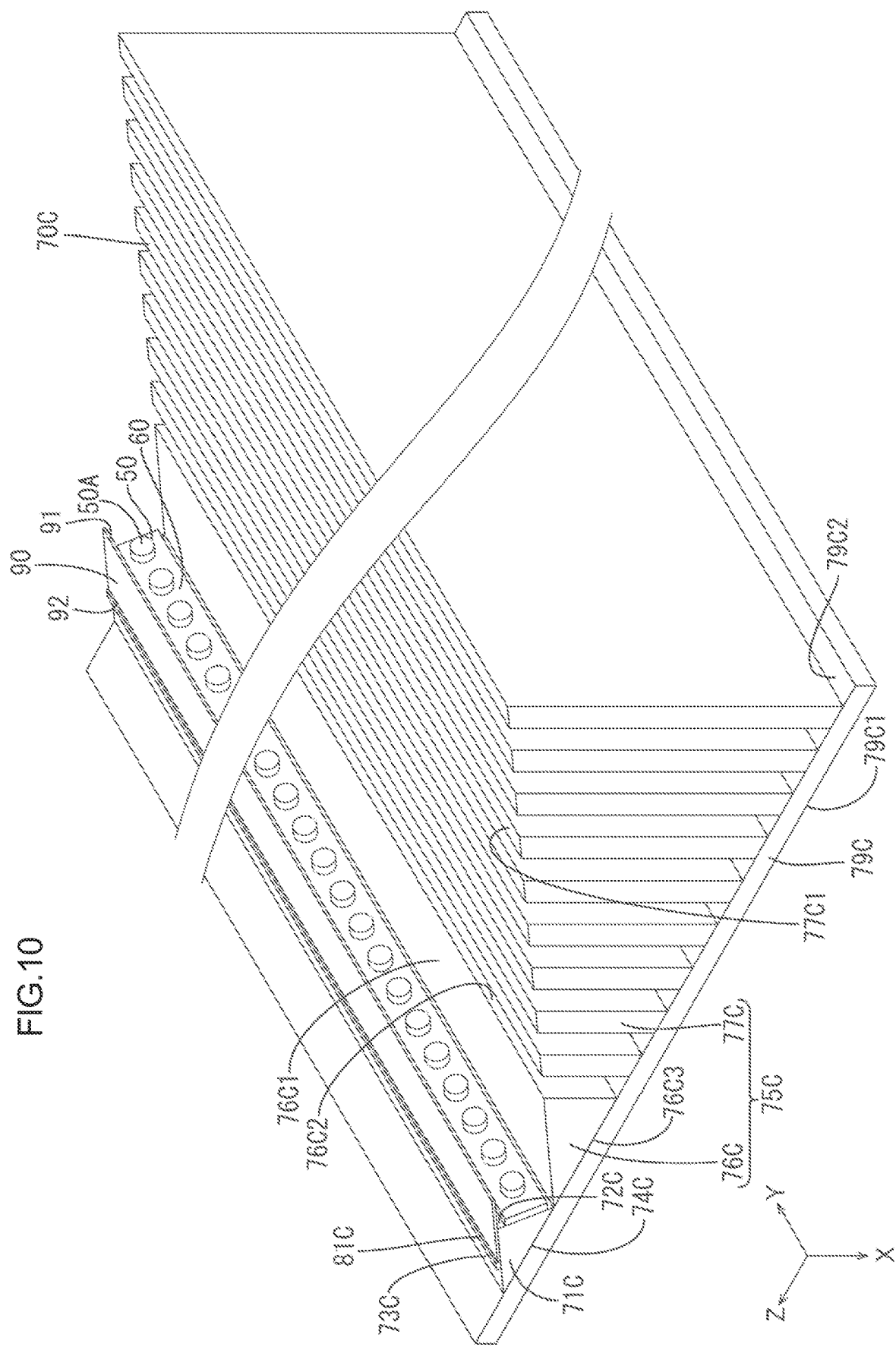
FIG. 10 is a perspective view of the right heatsink.

Next, the right heatsink 70C will be described in detail to describe the configuration of each of the heatsinks 70A, 70B, and 70C. The configurations of the heatsinks 70A, 70B, and 70C are the same and portions of the upper heatsink 70A or the left heatsink 70B indicated by reference signs with A or B correspond to portions of the right heatsink 70C indicated by the same numerals in the reference signs of the upper heatsink 70A or the left heatsink 70B. As illustrated in FIGS. 9 and 10, the right heatsink 70C includes an LED disposed portion 71C (an example of a light source disposed portion), a heat dissipating portion 75C, and a contact portion 79C. The LEDs 50 and an LED board 60 on which the LEDs 50 are mounted are disposed on the LED disposed portion 71C. The heat dissipating portion 75C includes a first fin 76C and second fins 77C for dissipation of heat produced by the LEDs 50. The contact portion 79C contacts the right side board 42 (a contact portion of the left heatsink 70B contacts the left side board 42, a contact portion of the upper heatsink 70A contacts the top board 43).

As illustrated in FIGS. 9 and 10, the contact portion 79C has an elongated plate shape. The contact portion 79C includes a first plate surface (a contact surface 79C1) contacts the side board 42. The right heatsink 70C can be easily attached to the case 40 with the contact surface 79C1 fixed to the side board 42 with an adhesive member (e.g., an adhesive tape, an adhesive). The other plate surface of the contact portion 79C on an opposite side from the contact surface 79C1 is referred to as an inner plate surface 79C2. The LED disposed portion 71C is disposed on a front section of the inner plate surface 79C2 (on a display surface 10DS side) and a heat dissipation portion 75C is disposed on a rear section of the inner plate surface 79C2 (on an opposite side form the display surface 10DS) with respect to the thickness direction of the liquid crystal panel 10 (the Z-axis direction).

As illustrated in FIG. 9, the LED disposed portion 71C has a triangular cross section. The LED disposed portion 71C includes a first sloped surface 72C, a second sloped surface 73C, and a bottom surface 74C. The first sloped surface 72C includes one of sloped sides of the triangular cross section. The second sloped surface 73C includes the other one of the sloped sides of the triangular cross section. The bottom surface 74C is along the thickness direction of the liquid crystal panel 10 (the Z-axis direction). The bottom surface 74C is connected to the inner plate surface 79C2 of the contact portion 79C. The first sloped surface 72C is at a predefined angle θ1 (a first slope angle) relative to the display surface 10DS. The first sloped surface 72C has an elongated plate surface facing the object J. The LED board 60 on which the LEDs 50 are mounted is disposed on the first sloped surface 72C.

Figure 11:
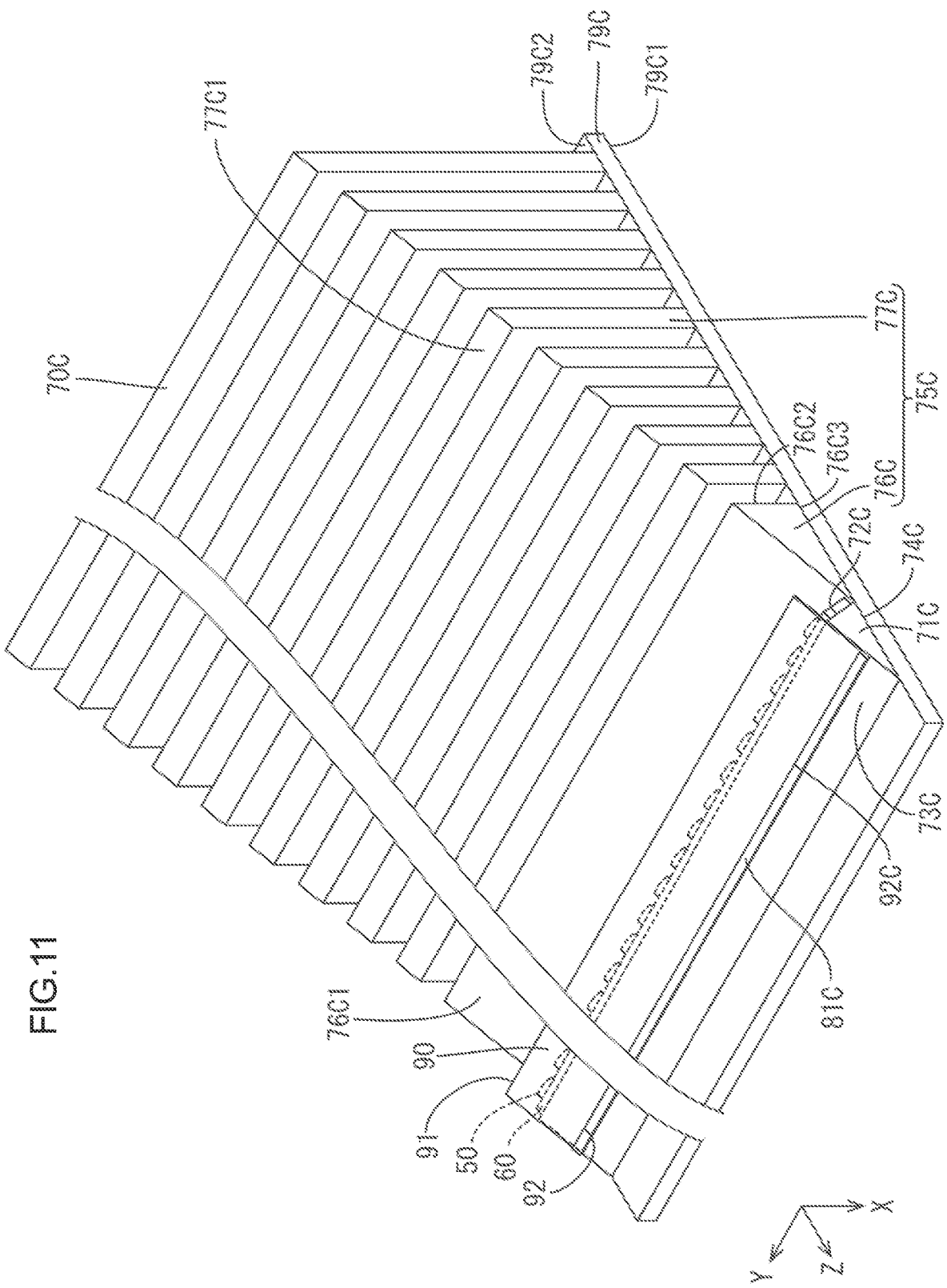
FIG. 11 is another perspective view of the right heats ink.

As illustrated in FIGS. 10 and 11, the LED board 60 has an elongated plate shape that extends in a longitudinal direction of the first sloped surface 72C. The LED board 60 includes a substrate made of metal such as aluminum. The substrate includes a mounting surface on which a wiring pattern is formed via an insulating layer. The LEDs 50 are arranged at equal intervals in line on the mounting surface of the LED board 60. The LEDs 50 are so-called top emitting type (top view type) LEDs that include top surfaces configured as light emitting surfaces. The LEDs 50 include bottom surfaces that are disposed on the mounting surface of the LED board 60.

Each of the LEDs 50 is configured such that a light emitting direction in which the luminance of emitting light is at the maximum matches a normal direction to the top surface 50A. The top surface 50A is parallel to the first sloped surface 72C. An angle between the light emitting direction of each of the LEDs 50 and a normal direction to the display surface 10DS (the thickness direction of the liquid crystal panel 10, the Z-axis direction) is equal to the first slope angle θ1 of the first sloped surface 72C. Therefore, the light emitting direction of each of the LEDs 50 can be adjusted by altering the first slope angle θ1 of the first sloped surface 72C. For example, if the liquid crystal panel 10 has a screen size of 90 inches, a dimension of the liquid crystal panel 10 in the right-left direction (the X-axis direction) is about 2 m. If a distance between the display surface 10DS of the liquid crystal panel 10 and the object J in the depth direction (the Z-axis direction) is 1 m and the first slope angle θ1 is set in a range from 25 degrees to 45 degrees, the liquid crystal panel 10 and the object J are properly illuminated by the LEDs 50. The first slope angle θ1 is set to 30 degrees in FIG. 9.

As illustrated in FIGS. 9 to 11, a reflecting sheet 90 having high light reflectivity (an example of a reflecting member) is disposed on the second sloped surface 73C. The reflecting sheet 90 has an elongated sheet shape that extends in a longitudinal direction of the second sloped surface 73C. The reflecting sheet 90 is disposed such that a long side surface 91 of the reflecting sheet 90 projects rearward. With the reflecting sheet 90 disposed as described above, some rays of emitting light from the LEDs 50 are reflected by the reflecting sheet 90. This reduces excessive expansion of the light from the LEDs 50 toward the liquid crystal panel 10. By adjusting a dimension of the long side surface 91 projecting rearward, the expansion of the emitting light from the LEDs 50 can be adjusted. In FIG. 9, an angle θ2 between the long side surface 91 and the center of the top surface 50A of each of the LEDs 50 is 45 degrees.

As illustrated in FIGS. 9 to 11, a protrusion 81C protrudes from the second sloped surface 73C. The protrusion 81C contacts the long side surface 91 and a long side surface 92 on an opposite side from the long side surface 91. With the protrusion 81C, the reflecting sheet 90 can be easily positioned on the second sloped surface 73C and thus accuracy in attachment of the reflecting sheet 90 improves. The dimension of the long side surface 91 projecting rearward can be accurately set and thus the expansion of the emitting light from the LEDs 50 can be accurately adjusted.

As illustrated in FIGS. 9 to 11, the heat dissipating portion 75C is disposed behind the LED disposed portion 71C with respect to the thickness direction of the liquid crystal panel 10. The heat dissipating portion 75C includes the first fin 76C and second fins 77C. The first fin 76C has a triangular cross section. The first fin 76C is disposed adjacent to the LED disposed portion 71C on the inner plate surface 79C2 of the contact portion 79C. The first fin 76C includes a first heat dissipating surface 76C1, a second heat dissipating surface 76C2, and a connecting surface 76C3. The first heat dissipating surface 76C1 and the second heat dissipating surface 76C2 are sloped surfaces that define the triangular cross section. The connecting surface 76C3 is connected to the inner plate surface 79C2.

As illustrated in FIGS. 9 to 11, each of the second fins 77C has an elongate plate shape. Each of the second fins 77C includes a plate surface that extends along the display surface 10DS. The second fins 77C are disposed behind the first fin 76C. The second fins 77C are arranged at equal intervals in the thickness direction of the liquid crystal panel 10. According to the configuration, a space behind the LED disposed portion 71C can be used to provide a rage number of the second fins 77C that exert high heat dissipating performance. Heat produced by each of the LEDs 50 is transmitted to the LED disposed portion 71C, the contact portion 79C, and the heat dissipating portion 75C via the LED board 60. The heat is released mainly from surfaces (contact surfaces contacting the air) of the first fin 76C and the second fins 77C. The plate surfaces of the second fins 77C have areas that become lager as a distance from the first fin 76C and the LED disposed portion 71C increases. In this configuration, the plate surface area of the second fin 77C that is the farthest from the LED disposed portion 71C can be increased to improve the heat dissipating performance of the heat dissipating portion 75.

As illustrated in FIG. 9, end surfaces 77C1 of the second fins 77C on an opposite side from the contact portion 79C are on an extended plane extending of the first heat dissipating surface 76C1 of the first fin 76C. A second slope angle θ3 between the first heat dissipating surface 76C1 and the connecting surface 76C3 is less than the first slope angle θ1. The second slope angle θ3 in FIG. 9 is 25 degrees. According to the configuration, the emitting light from the LEDs 50 is less likely to be blocked by the first fin 76C and the second fins 77C. Therefore, even if the object J illustrated in FIG. 7 is placed closer to the side board 42, the luminance of light that illuminates the object J is less likely to be reduced and thus the object J is properly illuminated.

Furthermore, the surfaces of the first fin 76C and the second fins 77C have high light reflectivity. Specifically, at least the surfaces are coated by paint having high light reflectivity (e.g., silver paint, white paint). According to the configuration, the emitting light from the LEDs 50 is more likely to reflect on the surfaces of the first fin 76C and the second fins 77C. Although the first fin 76C and the second fins 77C are disposed behind the LED disposed portion 71C, the brightness on the side board 42 side is less likely to be uneven due to adverse effects of the fins 76C and 77C.

Next, functions, operation, and effects of the liquid crystal display device 100 will be described. As described above, the LEDs 50 are disposed on the heatsinks 70A, 70B, and 70C, respectively. The heatsinks 70A, 70B, and 70C are disposed on the upper side, the left side, and the right side of the liquid crystal panel 10, respectively. The LEDs 50 are disposed not to overlap the liquid crystal panel 10. The heatsinks 70A, 70B, and 70C include LED disposed portions 71A, 71B, and 71C that include first sloped surfaces 72A, 72B, and 72C, respectively. The first sloped surfaces 72A, 72B, and 72C are at the first slope angle θ1 relative to the plane of the liquid crystal panel 10. The LEDs 50 are disposed on the first sloped surfaces 72A, 72B, and 72C. Light rays from the LEDs 50 travel toward the upper rear sides. When the subject to be illuminated (the object J) is placed behind the liquid crystal panel 10 in the liquid crystal display device 100 having such configurations (FIG. 7), the liquid crystal panel 10 and the object J are illuminated by the LEDs 50. An image and the article are overlapped and viewed. Namely, the liquid crystal display device 100 can be used as a see-through display. The liquid crystal display device 100 uses the LEDs 50, which are commonly used light sources, and the liquid crystal panel 10, which is a commonly used display panel. Namely, the liquid crystal display device 100 is a versatile see-through display.

The heatsinks 70A, 70B, and 70C include heat dissipating portions 75A, 75B, and 75C behind the LED disposed portions 71A, 71B, and 71C, respectively. The heat dissipating portions 75A, 75B, and 75C include second fins 77A, 77B, and 77C that exert higher heat dissipating performance. The second fins 77A, 77B, and 77C are aligned in a thickness direction of the liquid crystal panel 10. According to the configurations, spaces behind the LED disposed portions 71A, 71B, and 71C can be used to place a larger number of the second fins 77C. If the heat dissipating portions 75A, 75B, and 75C are disposed adjacent to the LED disposed portions 71A, 71B, and 71C in a horizontal direction of the display surface 10DS, a dimension of the upper heatsink 70A in the top-bottom direction increases and dimensions of the left heatsink 70B and the right heatsink 70C in the right-left direction increase. Namely, the widths of the upper frame section 41A, the left frame section 41B, and the right frame section 41C in front of the heatsinks 70A, 70B, and 70C need to be increased. In this embodiment, sufficient surface areas of the heatsinks 70A, 70B, and 70C for heat dissipation can be achieved in the front-rear direction of the liquid crystal display device 100. According to the liquid crystal display device 100, the widths of the upper frame section 41A, the left frame section 41B, and the right frame section 41C can be reduced without reducing the heat dissipating performance. Therefore, the versatile see-through display with a narrow frame is provided.

The LEDs 50 and the heatsinks 70A, 70B, and 70C may be disposed at least one of the upper side, the left side, and the right side of the liquid crystal panel 10. In this embodiment, they are disposed on the upper side, the left side, and the right side of the liquid crystal panel 10. This improves brightness. Furthermore, if the LEDs 50 and a heatsink are disposed on the lower side (behind the lower frame section 41D), the brightness further improves. In such a configuration, the lower heatsink may be mounted on the shelf board 45.

Second Embodiment

A second embodiment includes heatsinks having a configuration different from the configurations of the heatsinks 70A, 70B, and 70C in the first embodiment. The heatsinks in this embodiment have the same configuration and thus one of the heatsinks on the right side, which will be referred to as the right heatsink 170C, will be described with reference to FIGS. 12 through 14. The right heatsink 170C includes at least some of second fins 177C each having a configuration different from the configuration of the right heatsink 70C. Configuration, functions, operation, and effects similar to those of the first embodiment will not be described.

Figure 12:
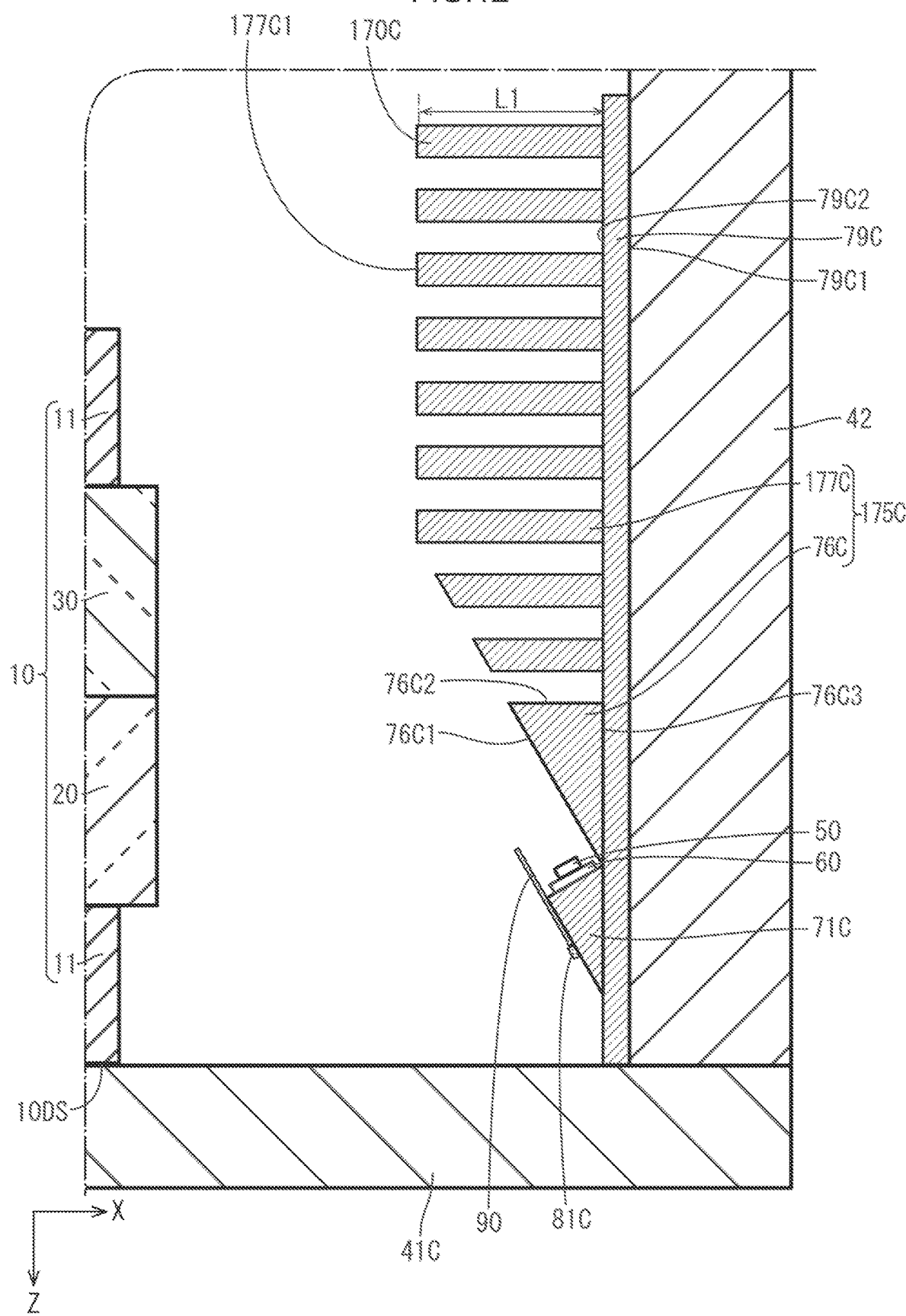
FIG. 12 is a magnified cross-sectional view including a right heatsink and therearound.
Figure 13:
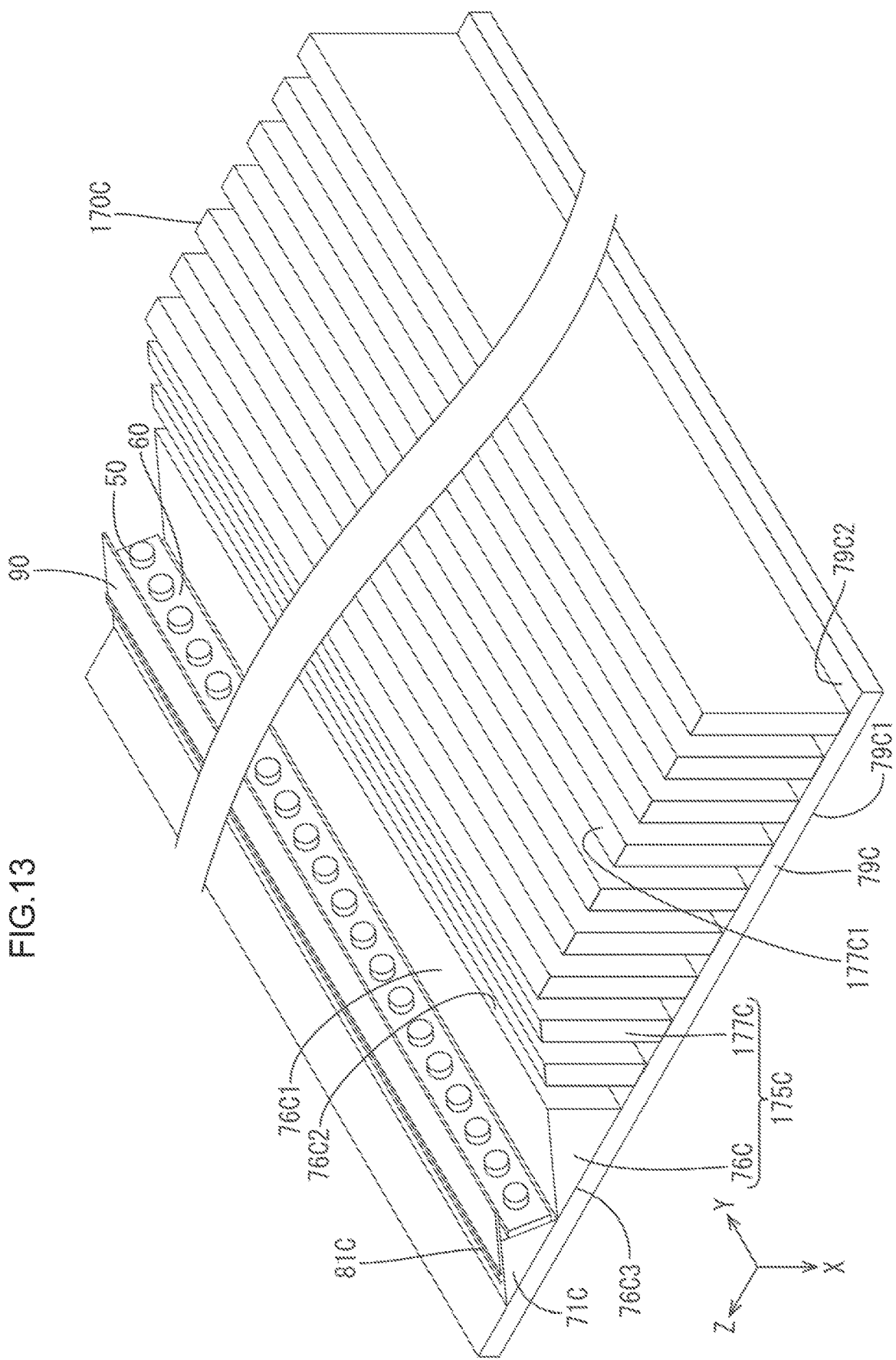
FIG. 13 is a perspective view of the right heatsink.
Figure 14:
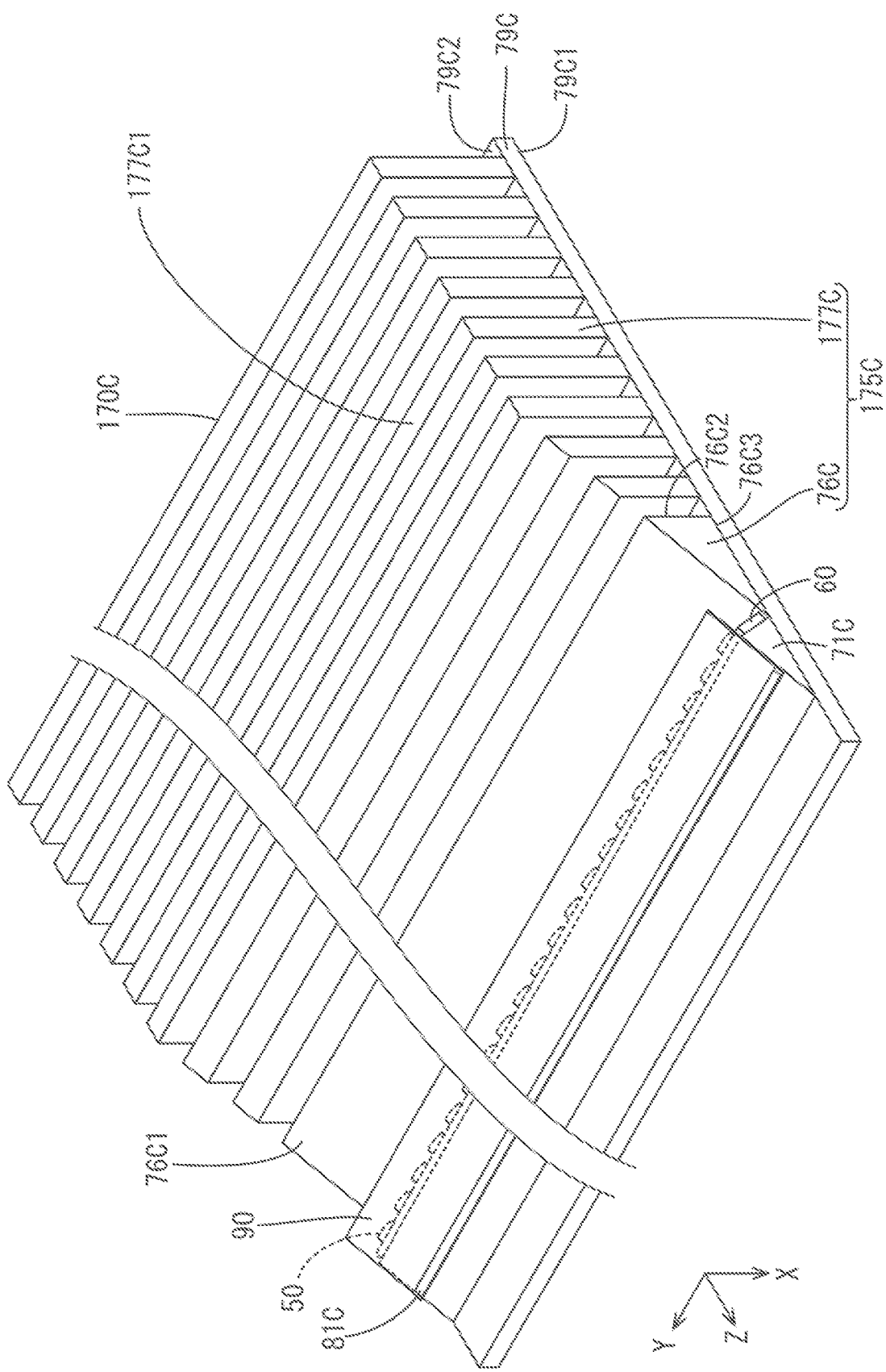
FIG. 14 is another perspective view of the right heats ink.

As illustrated in FIGS. 12 through 14, the second fins 177C of a heat dissipating portion 175C in the right heatsink 170C are formed such that areas of plate surfaces of the second fins 177C are within a limit (an upper limit). The end surfaces of the second fins 77C in the first embodiment are along the extended plane of the first heat dissipating surface 76C1. In the second embodiment, an end surface 177C1 of the second fin 177C farther from the LED disposed portion 71C is along the inner plate surface 79C2 so that the area of the plate surface does not exceed the upper limit. Regarding the second fins 177C having the areas of the plate surfaces less than the upper limit (specifically, the first and the second ones from the first fin 76C in the Z-axis direction in FIGS. 12 through 14.), the areas of the plate surfaces become larger as the distance from the LED disposed portion 71C increases. Regarding the second fins 177C having the areas of the plate surfaces exceeding the upper limit (specifically, the third to the nineth from the first fin 76C in the Z-axis direction in FIGS. 12 through 14), the areas of the plate surfaces are constant regardless of the distances from the LED disposed portion 71C.

In this configuration, each of the second fins 177C farther from the LED disposed portion 71C have a dimension L1 between the inner plate surface 79C2 and the end surface 177C1 is maintained smaller. Therefore, the light from the LEDs 50 is less likely to be excessively blocked by the second fins 177C. Even if the object J illustrated in FIG. 7 is placed closer to the side board 42, the luminance of light that illuminates the object J is less likely to be reduced and thus the object J is properly illuminated. Furthermore, shadows of the second fins 177C are less likely to be excessively large and thus the brightness on the side board 42 side is less likely to be uneven. Still furthermore, the second fins 177C are less likely to be heavy.

Third Embodiment

A third embodiment includes heatsinks having a configuration different from the configuration of the heatsinks 70A, 70B, and 70C in the first embodiment or the second embodiment. The heatsinks in this embodiment have the same configuration and thus one of the heatsinks on the right side, which will be referred to as the right heatsink 270C, will be described with reference to FIGS. 15 to 17. The right heatsink 270C includes second fins 277C each having a different shape from the right heatsink 70C or 170C in the first embodiment or the second embodiment. Configurations, functions, operation, and effects similar to those of the first embodiment or the second embodiment will not be described.

Figure 15:
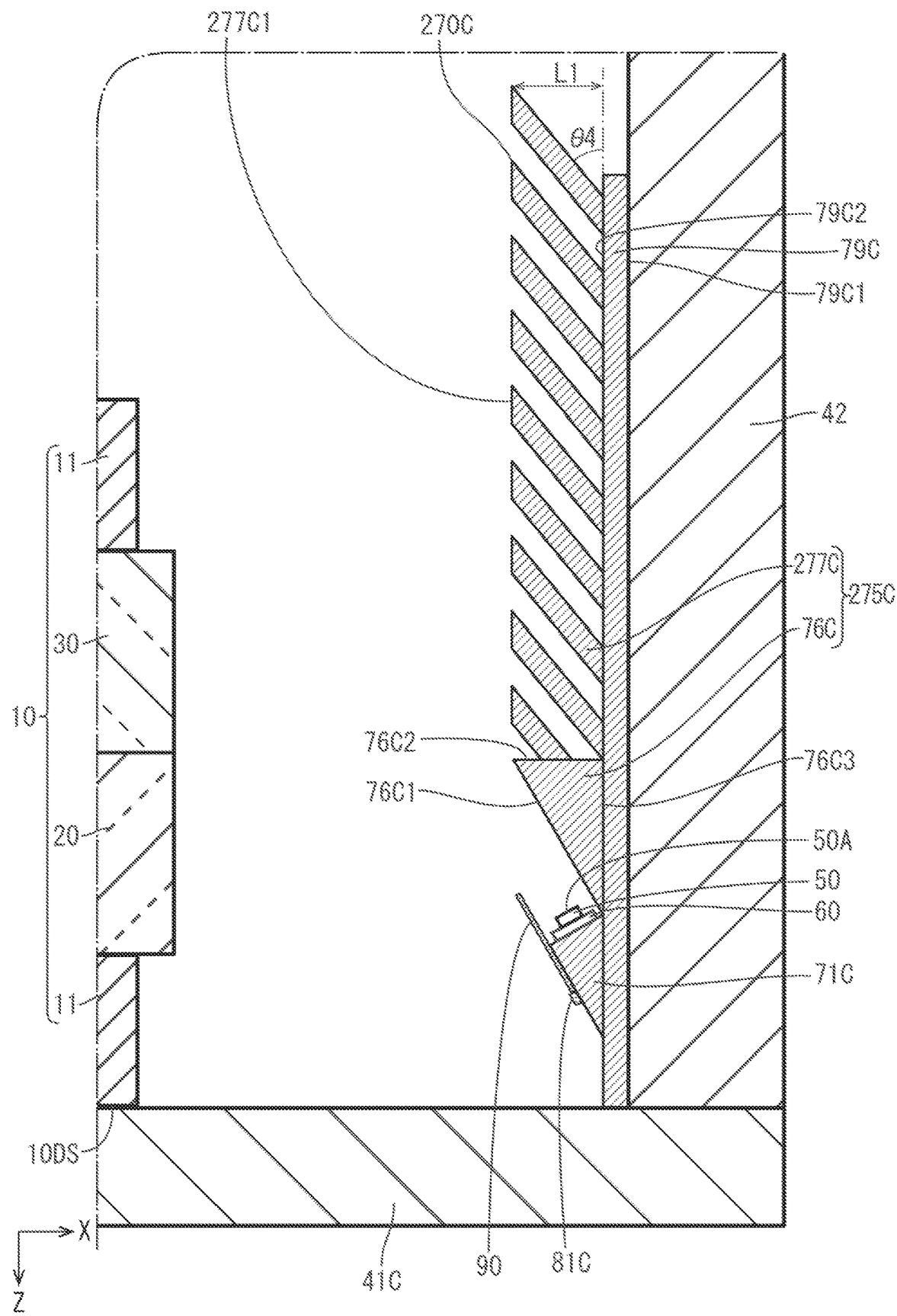
FIG. 15 is a magnified cross-sectional view including a right heatsink and therearound.
Figure 16:
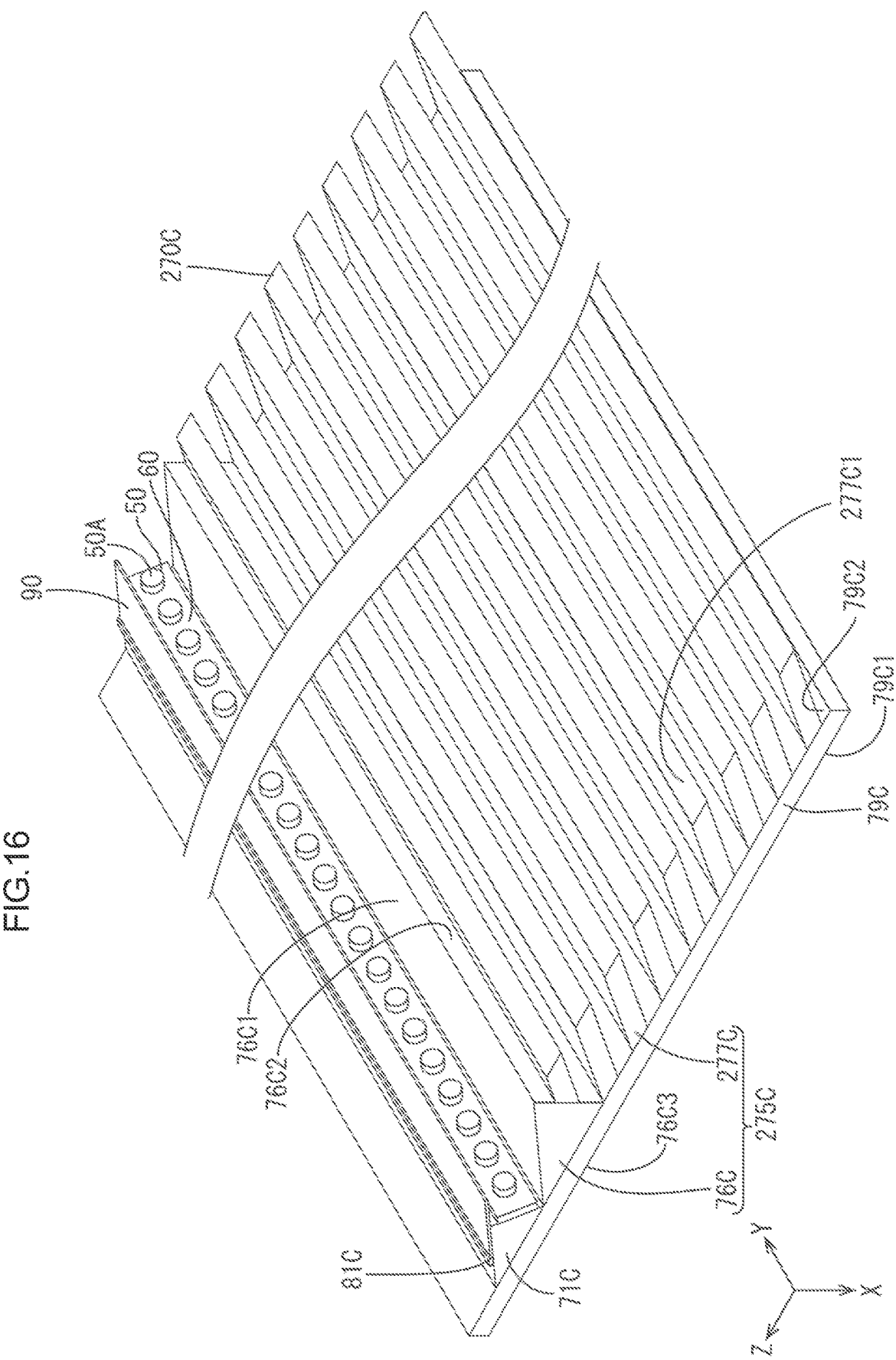
FIG. 16 is a perspective view of the right heatsink.
Figure 17:
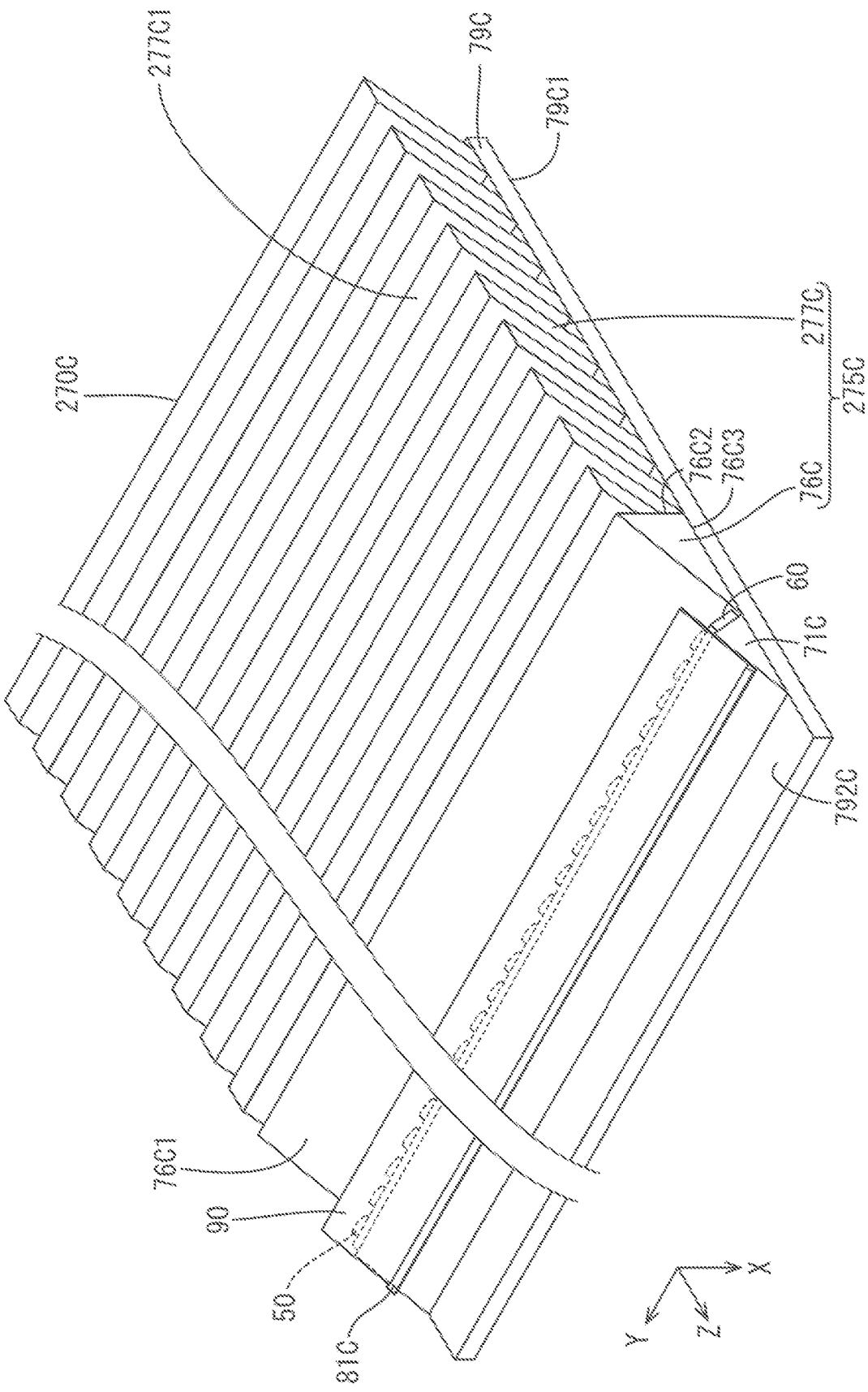
FIG. 17 is another perspective view of the right heats ink.

As illustrated in FIGS. 15 to 17, each of the second fins 277C of a heat dissipating portion 275C in the right heatsink 270C is angled relative to the display surface 10DS along a light emitting direction of the LEDs 50 (a normal direction to the top surfaces 50A). Because of the angle, one of the second fins 277C the closest to the first fin 76C is connected to the second heat dissipating surface 76C2 of the first fin 76C. An angle θ4 between each second fin 277C and the inner plate surface 79C2 in FIG. 15 is 45 degrees.

The areas of the plate surfaces can be easily increased by tilting the second fins 277C. Furthermore, the dimension L1 between an end surface 277C1 of each second fin 277C and the inner plate surface 79C2 can be further reduced. The light from the LEDs 50 is less likely to be excessively blocked by the second fins 277C although the heat dissipating performance is maintained. Even if the object J illustrated in FIG. 7 is placed closer to the side board 42, the luminance of light that illuminates the object J is less likely to be reduced and thus the object J is properly illuminated. Furthermore, shadows of the second fins 277C are less likely to be excessively large and thus the brightness on the side board 42 side is less likely to be uneven.

Fourth Embodiment

A liquid crystal display device 300 (an example of a display device) according to a fourth embodiment will be described with reference to FIGS. 3, 4, and 18 to 25. X-axes, Y-axes, and Z-axes may be present in the drawings. The axes in each drawing indicate directions that correspond to directions indicated by the respective axes in other drawings. A+ side of the Z-axis) indicates the front side and a− side of the Z-axis indicates the rear side (the back side). Configurations, functions, operation, and effects similar to those of the first embodiment to the third embodiment will not be described.

Figure 18:
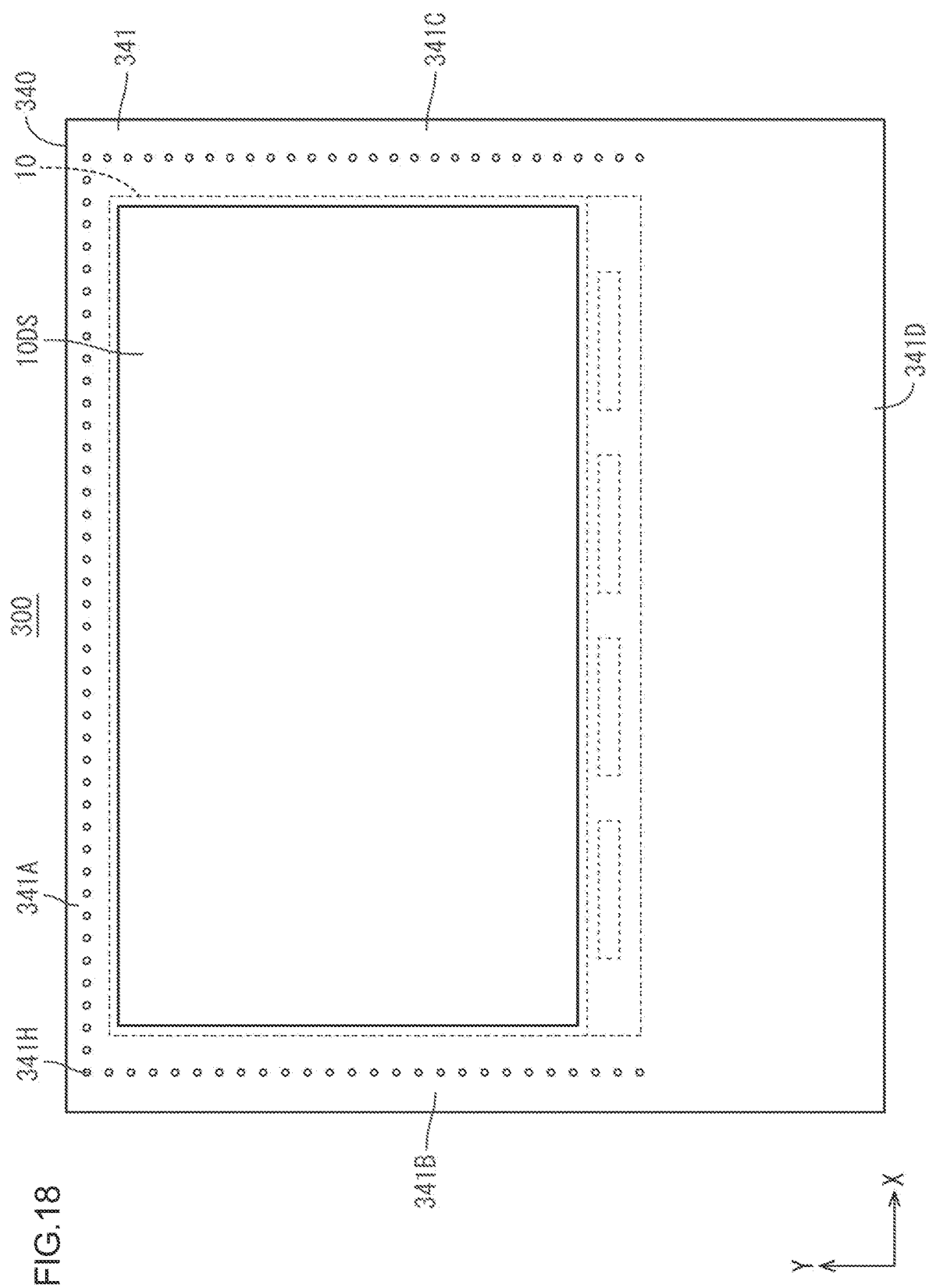
FIG. 18 is a front view of a liquid crystal display device.

As illustrated in FIG. 18, the liquid crystal display device 300 has a horizontally-long rectangular overall shape and includes the liquid crystal panel 10 (an example of a display panel) housed in a case 340 (an example of a frame). The liquid crystal display device 300 is used as a see-through display that is configured to display images superimposed over the object J. Examples of the object J include exhibits and products. Examples of the images include information on the exhibits or the products and accessory images to decorate the object J. The liquid crystal panel 10 has transparency and thus an image displayed on the liquid crystal panel 10 is superimposed over the object J that is disposed behind the liquid crystal panel 10 (see FIG. 22) and viewed through the liquid crystal panel 10. The liquid crystal panel 10 has a mid to large screen size (about 60 inches to 90 inches).

Figure 19:
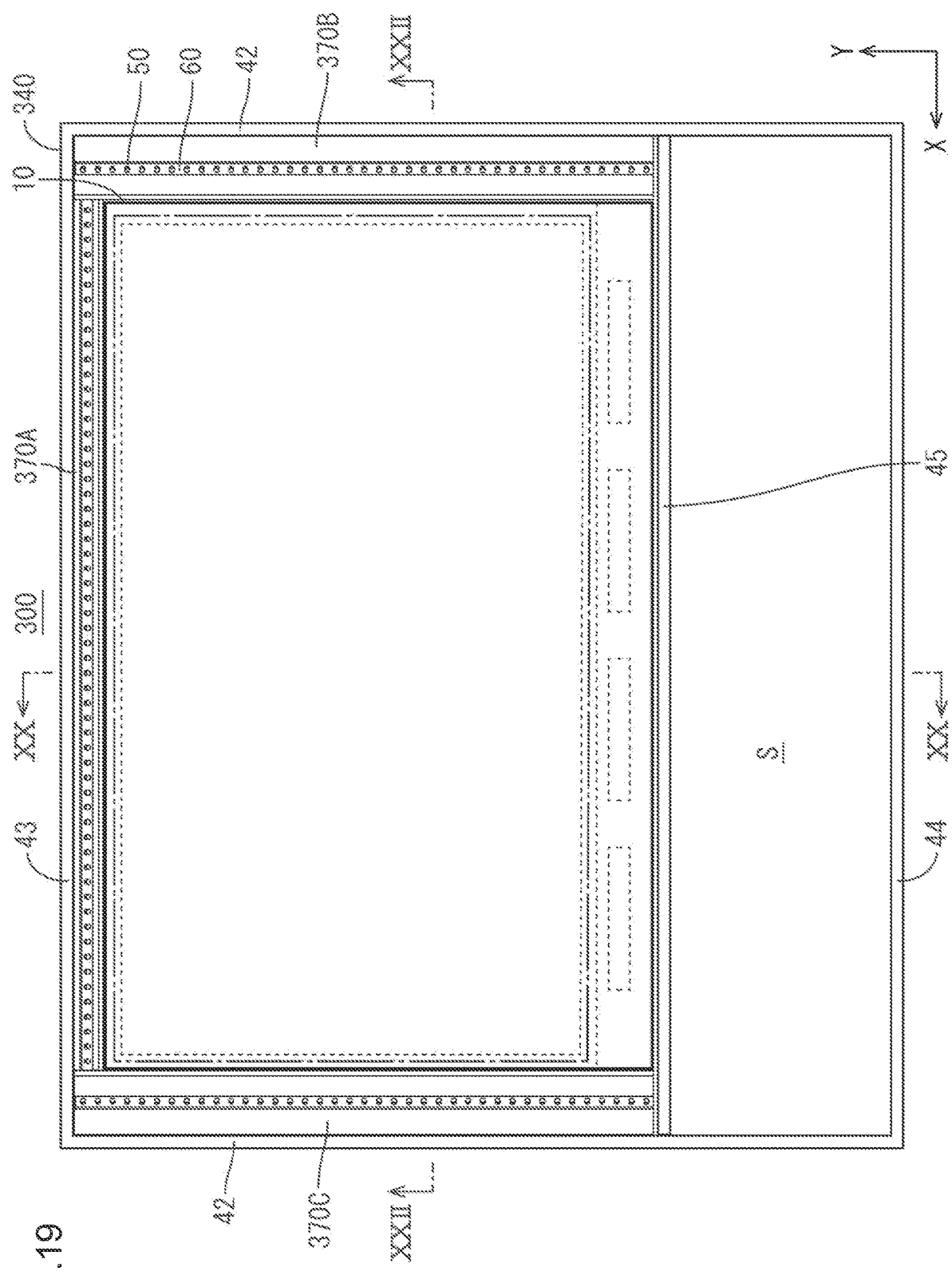
FIG. 19 is a rear view of the liquid crystal display device.

As illustrated in FIGS. 18 and 19, the liquid crystal display device 300 includes the liquid crystal panel 10, a case 340 (an example of the frame), the LEDs 50 (an example of light sources), the LED boards 60 (an example of a light source board), and three heatsinks 370A, 370B, and 370C. The heatsinks 370A, 370B, and 370C are disposed in front of the LED boards 60 to dissipate heat produced by the LEDs 50.

Figure 20:
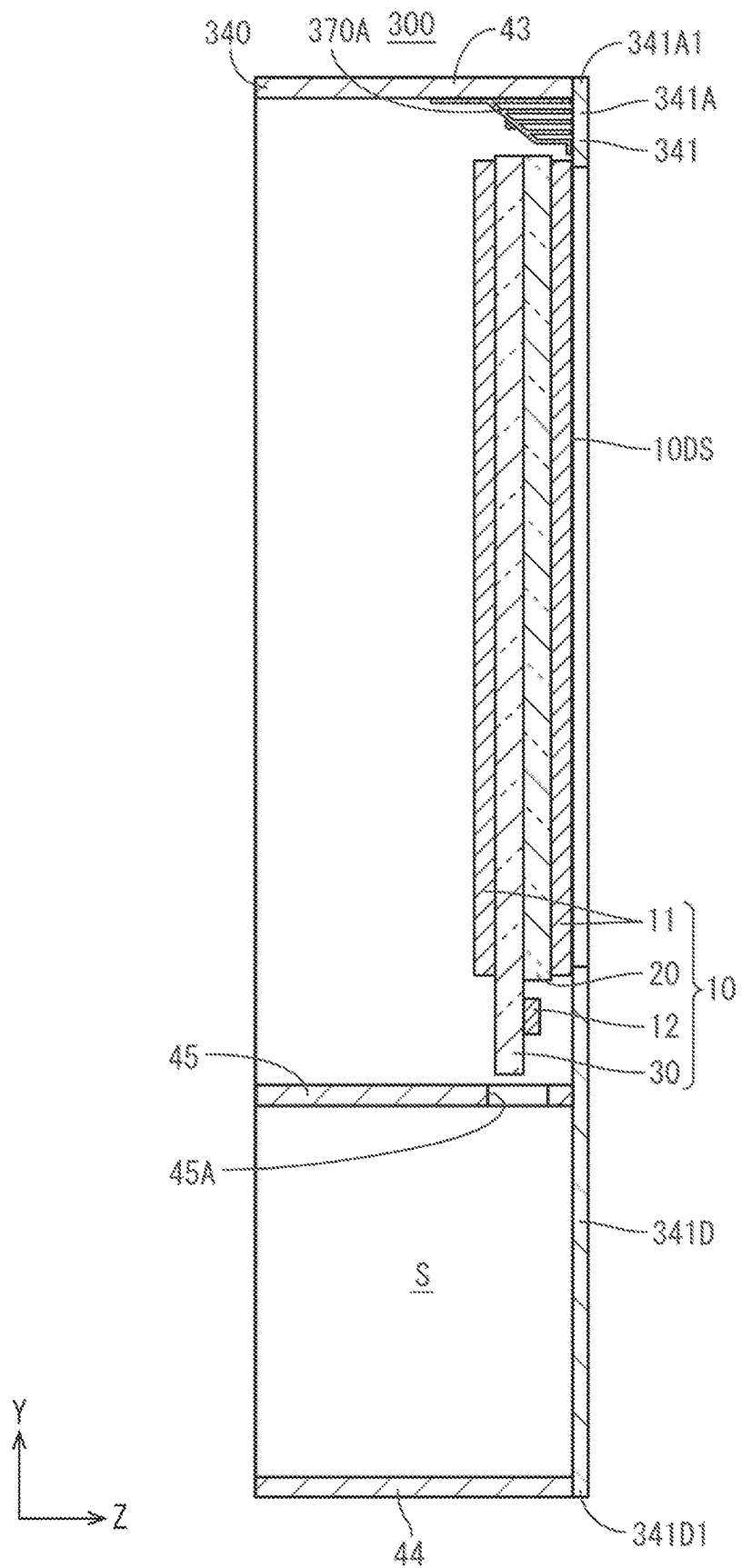
FIG. 20 is a cross-sectional view along line XX-XX in FIG. 19.

The case 340 is made of wood. As illustrated in FIGS. 18, 19 and 20, the case 340 holds the liquid crystal panel 10 therein with the liquid crystal panel 10 in a vertical position (in the Y-axis direction, an example of a direction perpendicular to the horizontal direction). The case 340 includes a frame portion 341, two side boards 42, the top board 43, the bottom board 44, and the shelf board 45. The frame portion 341 is a frame-shaped board on the front side. The frame portion surrounds the display area AA of the liquid crystal panel 10. The frame portion 341 includes an upper frame section 341A, a left frame section 341B, a right frame section 341C, and a lower frame section 341D that define four edges of an opening that overlaps the display area AA. The lower frame section 341D has a width greater than a width of the upper frame section 341A. As illustrated in FIG. 20, a space S is provided behind the lower frame section 341D (under the liquid crystal panel 10) for holding external devices (such as a computer) therein.

Figure 22:
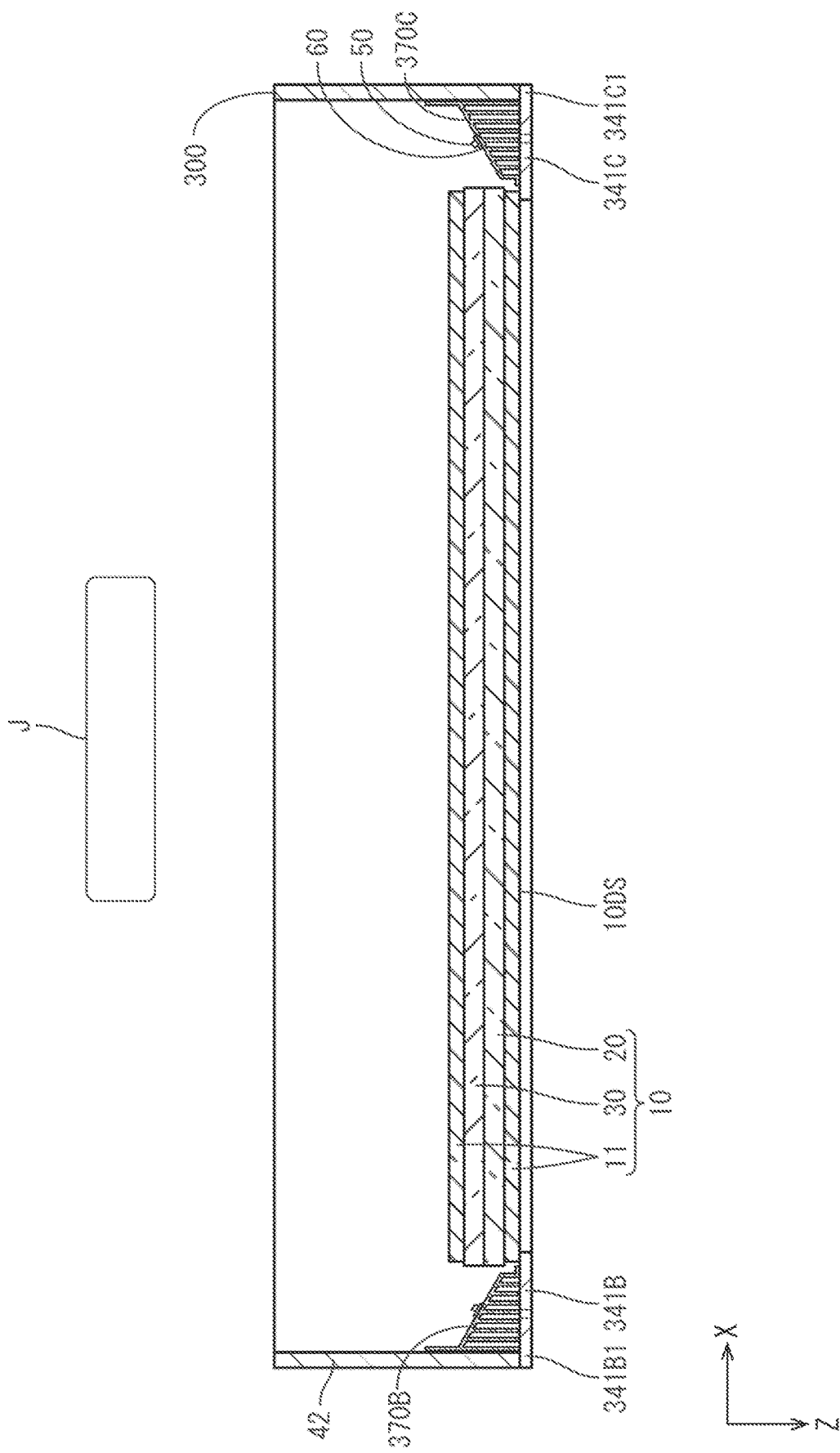
FIG. 22 is a cross-sectional view along line XXII-XXII in FIG. 19.

As illustrated in FIG. 20, the top board 43 extends rearward from an upper edge 341A1 of the upper frame section 341A in a thickness direction of the liquid crystal panel 10 (in the Z-axis direction). The top board 43 connects an upper edge of one of the side boards 42 to an upper edge of the other. The bottom board 44 extends rearward from a lower edge 341D1 of the lower frame section 341D in the Z-axis direction. The bottom board 44 connects a lower edge of one of the side boards 42 to a lower edge of the other. The shelf board 45 extends rearward from a back surface of the lower frame section 341D in the Z-axis direction. The shelf board 45 includes the through hole 45A that is drilled through the shelf board 45 in the vertical direction. A cable may be passed through the through hole and connected to the liquid crystal panel 10. As illustrated in FIG. 22, the side boards 42 extend rearward from a left edge 341B1 of the left frame section 341B and a right edge 341C1 of the right frame section 341C in the Z-axis direction, respectively.

As illustrated in FIG. 18, the upper frame section, the left frame section 341B, and the right frame section 341C includes round ventilation holes 341H. As illustrated in FIG. 19, three heatsinks 370A, 370B, and 370C each having elongated shapes disposed behind the upper frame section 341A, the left frame section 341B, and the right frame section 341C, respectively. The LED boards 60 on which the LEDs 50 are mounted are disposed on the heatsinks 370A, 370B, and 370C, respectively. The ventilation holes 341H are arranged opposite the heatsinks 370A, 370B, and 370C, respectively, when viewed from the front side, to release heat from the heatsinks 370A, 370B, and 370C to the outside and improve heat dissipating performance.

The heatsinks 370A, 370B, and 370C are referred to as follows based on locations: an upper heatsink 370A, a left heatsink 370B, and a right heatsink 370C. The upper heatsink 370A is disposed on an upper side of the liquid crystal panel (behind the upper frame section 341A to extend in the right-left direction (the X-axis direction)). The left heatsink 370B and the right heatsink 370C (side heatsinks 370B and 370C) are disposed on a left side and the right side of the liquid crystal panel 10 (behind the left frame section 341B and the right frame section 341C) to extend in the top-bottom direction (the Y-axis direction).

Figure 21:
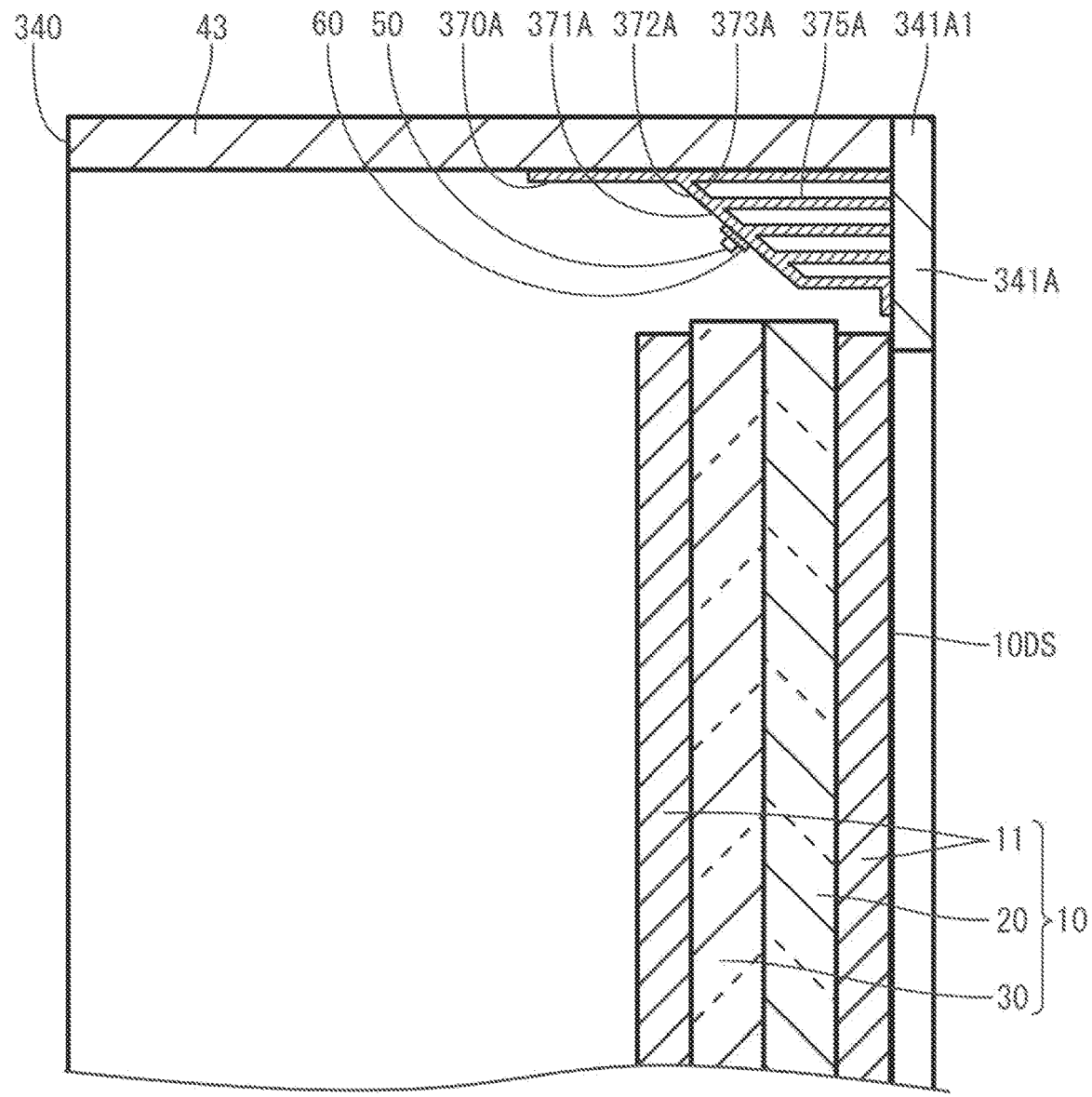
FIG. 21 is a magnified partial view of FIG. 20.
Figure 23:
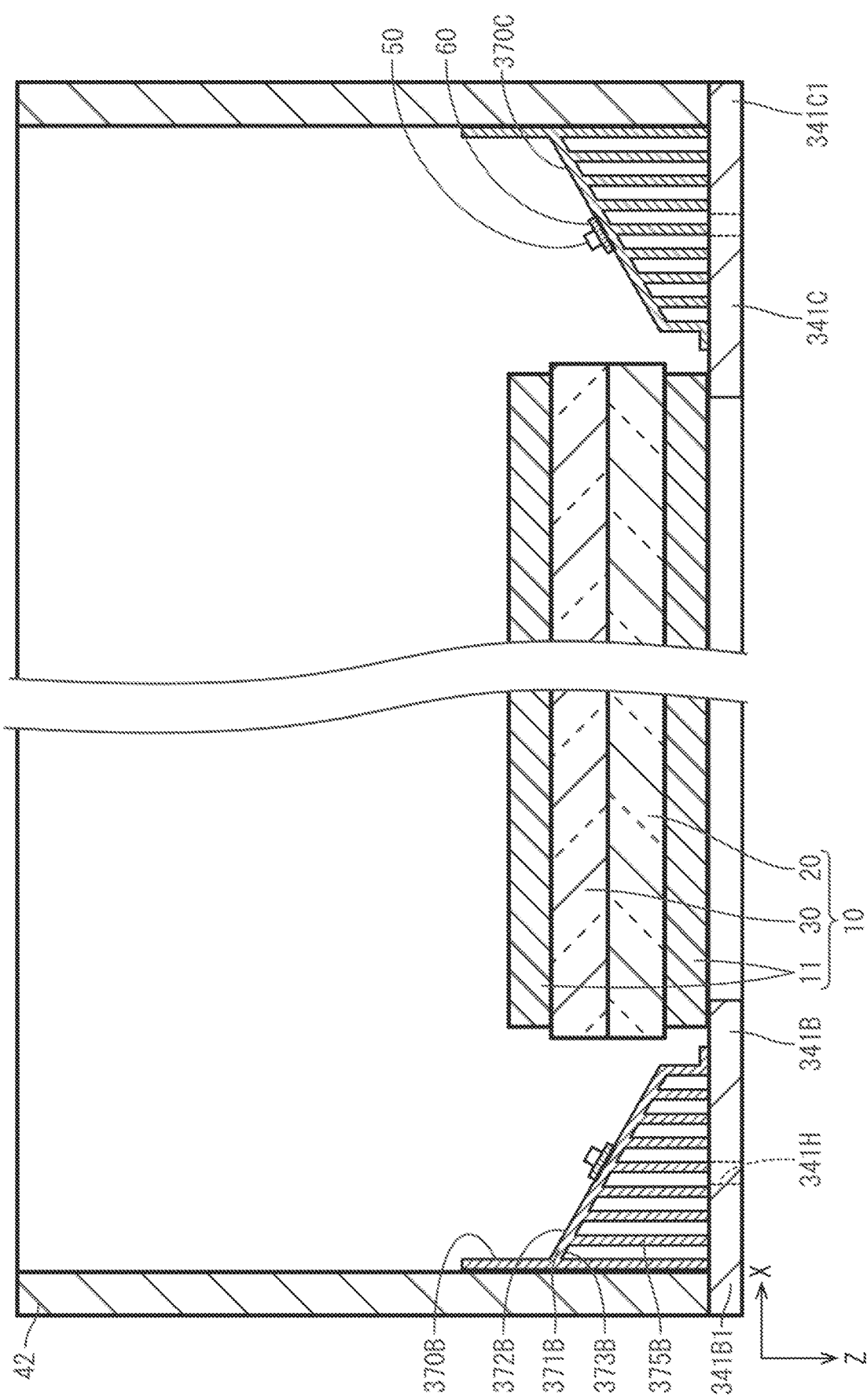
FIG. 23 is a magnified view of FIG. 22.

As illustrated in FIGS. 20 and 21, the upper heatsink 370A is attached to a corner at which the upper frame section 341A and the top board 43 are connected. As illustrated in FIGS. 22 and 23, the left heatsink 370B is attached to a corner at which the left frame section 341B and the left side board 42 are connected. The right heatsink 370C is attached to a corner at which the right frame section 341C and the right side board 42 are connected. Each of the heatsinks 370A, 370B, and 370C is made of aluminum and includes portions that are integrally formed by extrusion molding. A dimension of each of the heatsinks 370A, 370B, and 370C in a longitudinal direction is easily adjustable according to a size of the liquid crystal panel 10 by adjusting a pushing distance in the production.

Figure 24:
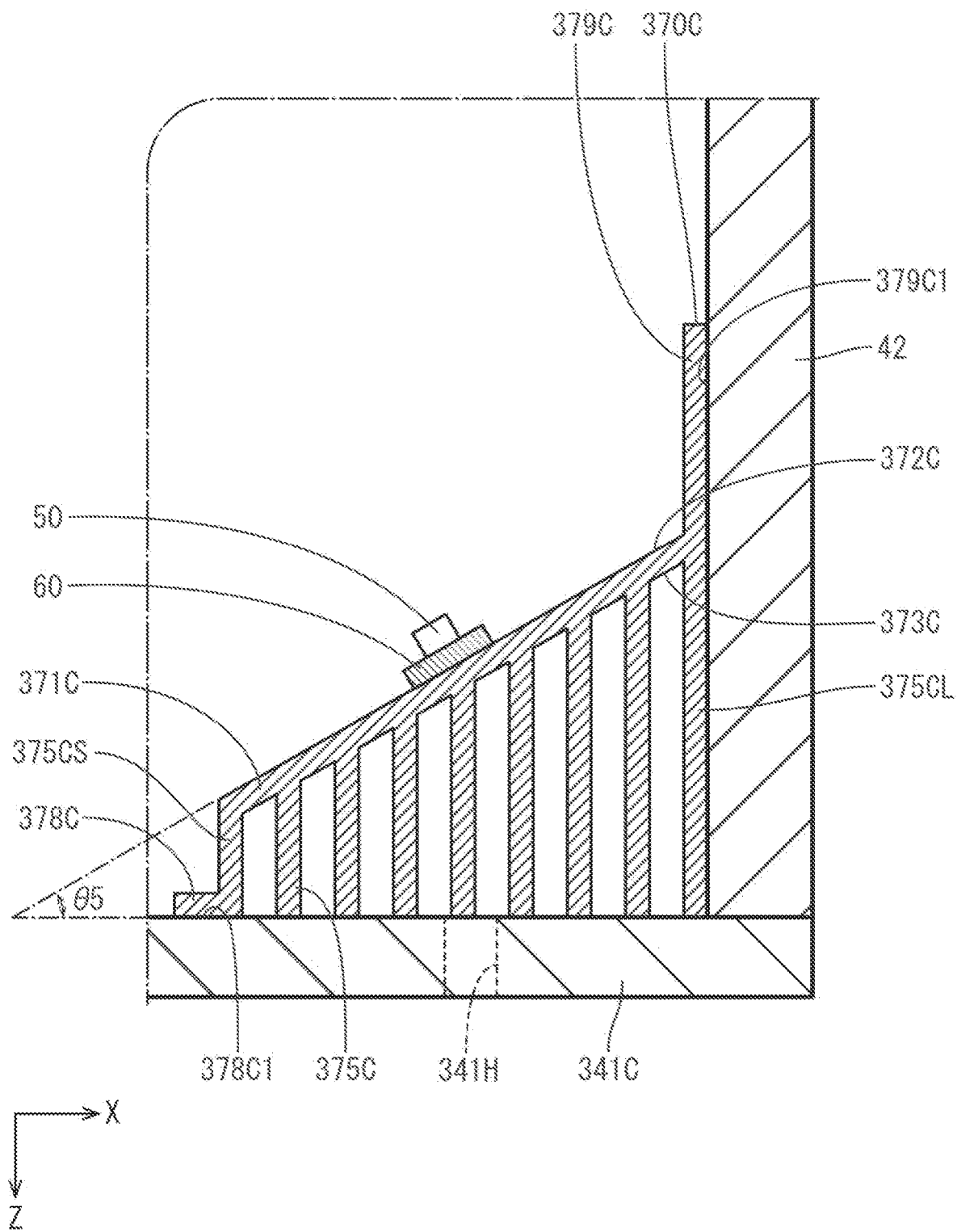
FIG. 24 is a magnified cross-sectional view including a right heatsink and therearound.
Figure 25:
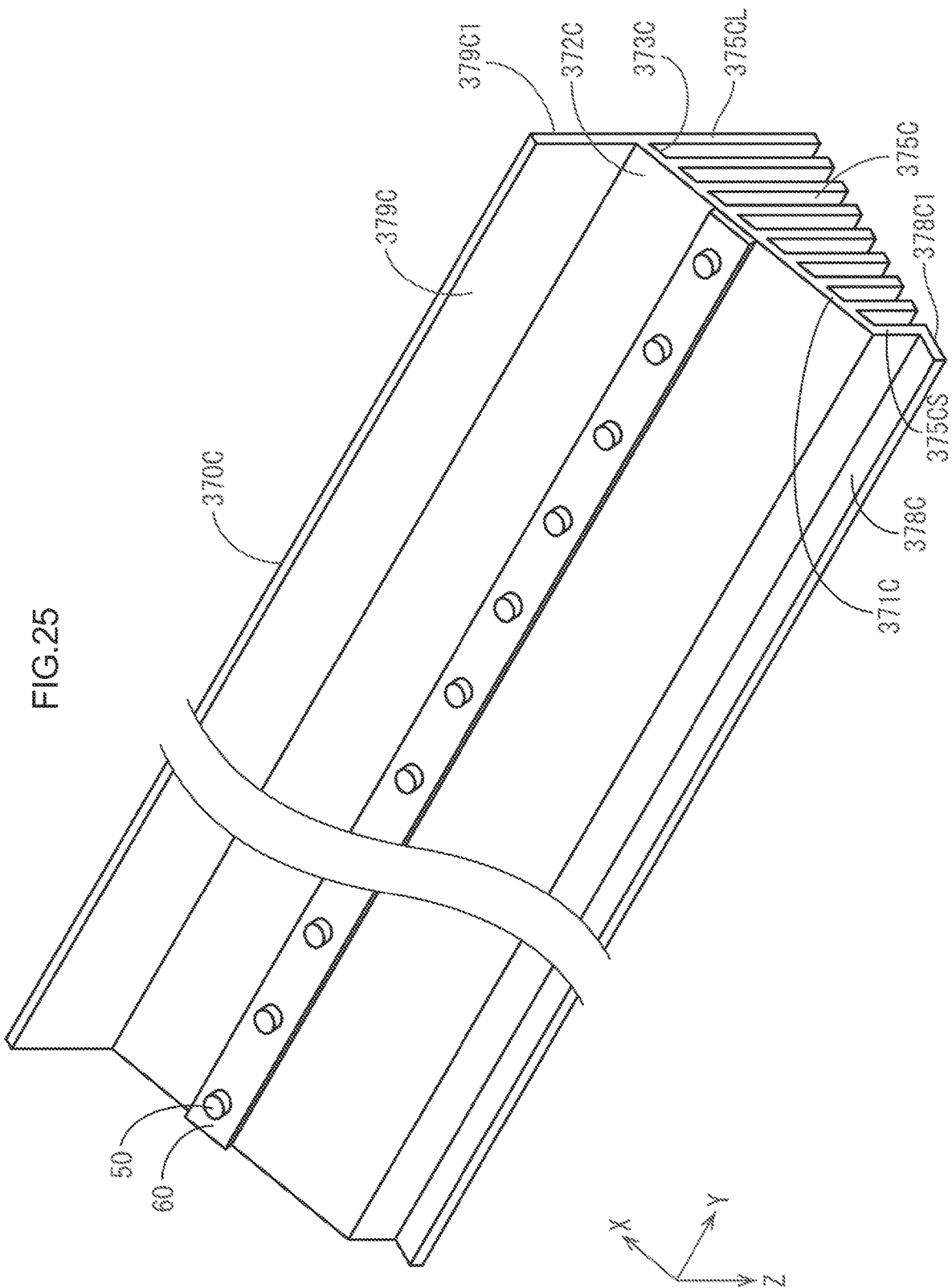
FIG. 25 is a perspective view of the right heatsink.

Next, configurations of the heatsinks 370A, 370B, and 370C will be described. The configuration of the right heatsink 370C will be described in detail. The configurations of the heatsinks 370A, 370B, and 370C are the same and portions of the upper heatsink 370A or the left heatsink 370B indicated by reference signs with A or B correspond to portions of the right heatsink 370C indicated by the same numerals in the reference signs of the upper heatsink 370A or the left heatsink 370B. As illustrated in FIGS. 24 and 25, the right heatsink 370C includes a sloped portion 371C, fins 375C, a first contact portion 378C, and a second contact portion 379C. The sloped portion 371C has an elongated plate shape inclined at an angle θ5 (e.g., 30 degrees) relative to a plane of the liquid crystal panel 10 (X-Y plane). One of surfaces of the sloped portion 371C on the back side (on an opposite side from the display surface 10DS) is referred to as a first plate surface 372C. The LEDs 50 mounted on the LED board 60 are disposed on the first plate surface 372C.

As illustrated in FIG. 25, the LED board 60 has an elongated plate shape that extends in a longitudinal direction of the first plate surface 372C. The LED board 60 includes a substrate made of metal such as aluminum. The substrate includes a mounting surface on which a wiring pattern is formed via an insulating layer. The LEDs 50 are arranged at equal intervals in line on the mounting surface of the LED board 60. The LEDs 50 are so-called top emitting type (top view type) LEDs that include top surfaces configured as light emitting surfaces. The LEDs 50 include bottom surfaces that are disposed on the mounting surface of the LED board 60.

As illustrated in FIGS. 24 and 25, the fins 375C protrude from a second plate surface 373C of the sloped portion 371C on the front side in the Z-axis direction (a thickness direction of the liquid crystal panel 10) toward the front side. The fins 375C are arranged at equal intervals in the X-axis direction (an example of a plane direction of the liquid crystal panel 10). Each of the fins 375C has an elongated plate shape. A dimension of each of the fins 375C in the longitudinal direction (the Y-axis direction) is equal to the dimension of the sloped portion 371C in the longitudinal direction. The dimensions (the distance of projection) of the fins 375C in a short direction (the Z-axis direction) become greater as a distance from the liquid crystal panel 10 increases. According to the configuration, a space on the second plate surface 373C side of the sloped portion 371C (a space between the sloped portion 371C and the right frame section 341C) can be used to provide the fins 375C. Heat produced by the LEDs 50 is transmitted to the fins 375C and the sloped portion 371C via the LED board 60 and released from the surfaces of the fins 375C and the sloped portion 371C. A proportion of the heat may be released to the outside through a ventilation hole 341H.

As illustrated in FIGS. 24 and 25, the first contact portion 378C has an elongate plate shape. The first contact portion 378C includes a contact surface 378C1 that contact the right frame section 341C. The first contact portion 378C is located at a distal end of the short fin 375CS that has a shortest projecting dimension (the closest to the liquid crystal panel 10). The first contact portion 378C extends from the distal end toward the liquid crystal panel 10 along the plate surface of the right frame section 341C. The second contact portion 379C has an elongated plate shape. The second contact portion 379C includes a contact surface 379C1 that contacts the side board 42. The second contact portion 379C is located at a connecting portion of the long fin 375CL that has the largest projecting dimension (the farthest from the liquid crystal panel 10) with which the sloped portion 371C is connected. The second contact portion 379C extends from the connecting portion along the plate surface of the side board 42. The right heatsink 370C can be easily attached to the case 340 with the contact surfaces 378C1 and 379C1 fixed to the right frame section 341C and the side board 42 with fixing members (e.g., adhesive tapes, adhesives).

Next, functions, operation, and effects of the liquid crystal display device 300 will be described. As described above, the LEDs 50 are disposed on the heatsinks 370A, 370B, and 370C, respectively. The heatsinks 370A, 370B, and 370C are disposed on the upper side, the left side, and the right side of the liquid crystal panel 10, respectively. The LEDs 50 are disposed not to overlap the liquid crystal panel 10. The heatsinks 370A, 370B, and 370C include sloped portions 371A, 371B, and 371C that are at the angle θ5 relative to the plane of the liquid crystal panel 10. The LEDs 50 are disposed on first plate surfaces 372A, 372B, and 372C of the sloped portions 371A, 371B, and 371C on the back side. Light rays from the LEDs 50 travel toward the upper rear sides. When a subject to be illuminated (an object J) is placed behind the liquid crystal panel 10 in the liquid crystal display device 300 having such configurations (FIG. 22), the liquid crystal panel 10 and the object J are illuminated by the LEDs 50. An image and the article are overlapped and viewed. Namely, the liquid crystal display device 300 can be used as a see-through display. The liquid crystal display device 300 uses the LEDs 50, which are commonly used light sources, and the liquid crystal panel 10, which is a commonly used display panel. Namely, the liquid crystal display device 300 is a versatile see-through display.

The heatsinks 370A, 370B, and 370C include fins 375A, 375B, and 375C that protrude from second plate surfaces 373A, 373B, and 373C of the sloped portions 371A, 371B, and 371C on the front side, respectively. The dimensions of the fins 375A, 375B, and 375C in the short direction become greater as the distance from the liquid crystal panel 10 increases. According to the configurations, spaces beside the second plate surface 373A, 373B, and 373C of the sloped portions 371A, 371B, and 371C can be used to place the fins 375A, 375B, and 375C that release heat to the spaces. According to the configurations, the heatsinks 370C, 370B, and 370C can be reduced in size without reductions in heat dissipation performance. If the widths (the dimensions in the short direction) of the sloped portions 371A, 371B, and 371C are increased to improve the heat dissipation performance, the widths of the upper frame section 341A, the left frame section 341B, and the right frame section 341C need to be increased along with the increase in width of the sloped portions 371A, 371B, and 371C. According to the liquid crystal display device 300 according to this embodiment, the increase in width of the upper frame section 341A, the left frame section 341B, and the right frame section 341C is not required. Therefore, the versatile see-through display with a narrow frame is provided.

The LEDs 50 and the heatsinks 370A, 370B, and 370C may be disposed at least one of the upper side, the left side, and the right side of the liquid crystal panel 10. In this embodiment, they are disposed on the upper side, the left side, and the right side of the liquid crystal panel 10. This improves brightness. Furthermore, if the LEDs 50 and a heatsink are disposed on the lower side (behind the lower frame section 341D), the brightness further improves.

Fifth Embodiment

This embodiment includes heatsinks and diffuser sheets (an example of an optical member) provided for the heatsinks, respectively. Configurations of the heatsinks are similar to one another. Therefore, one of the heatsinks on the right side, which will be referred to as the right heatsink 470C, will be described with reference to FIGS. 26 and 27. Configurations, functions, operation, and effects similar to those of the fourth embodiment will not be described.

Figure 26:
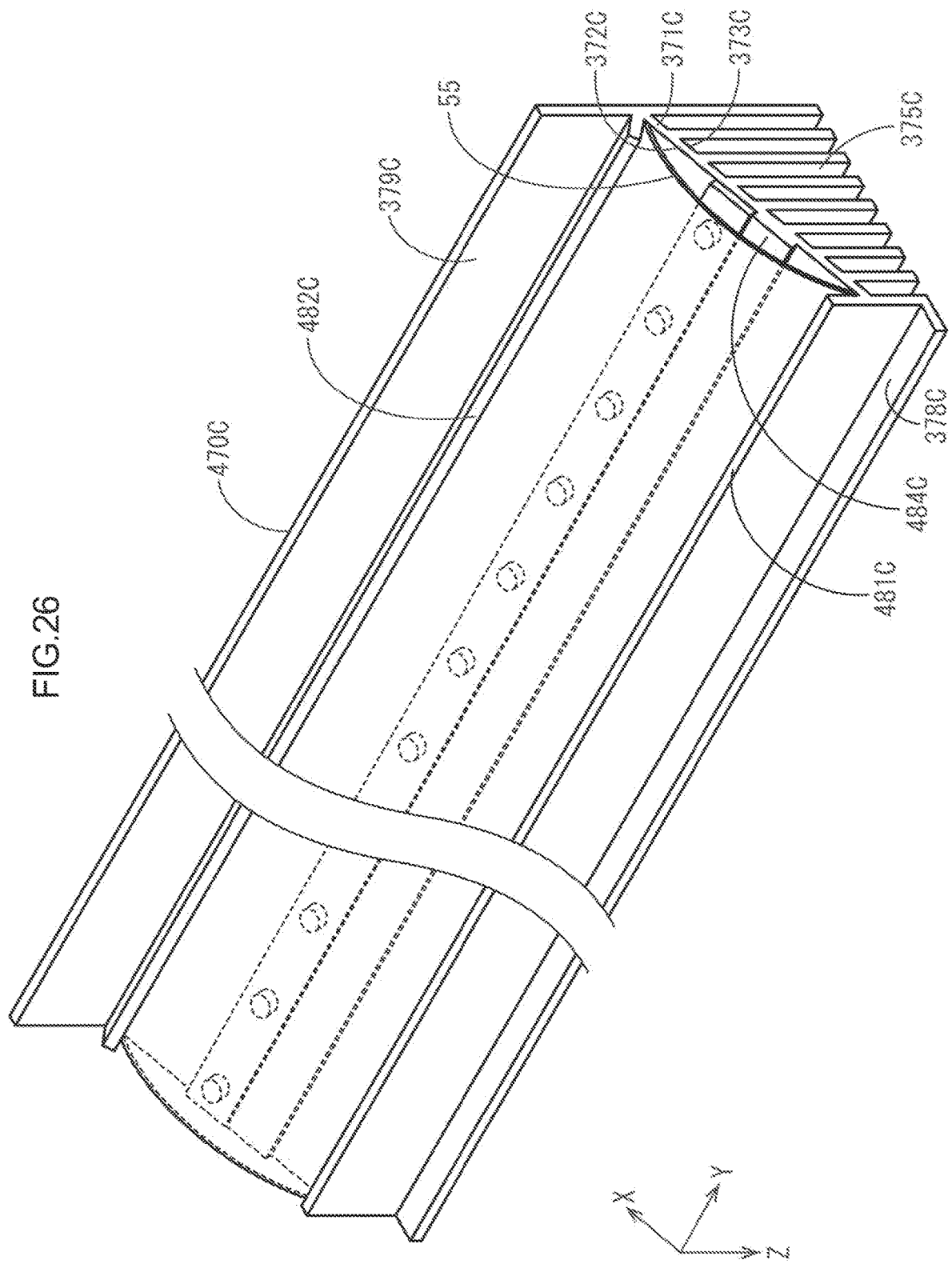
FIG. 26 is a perspective view of a right heatsink.
Figure 27:
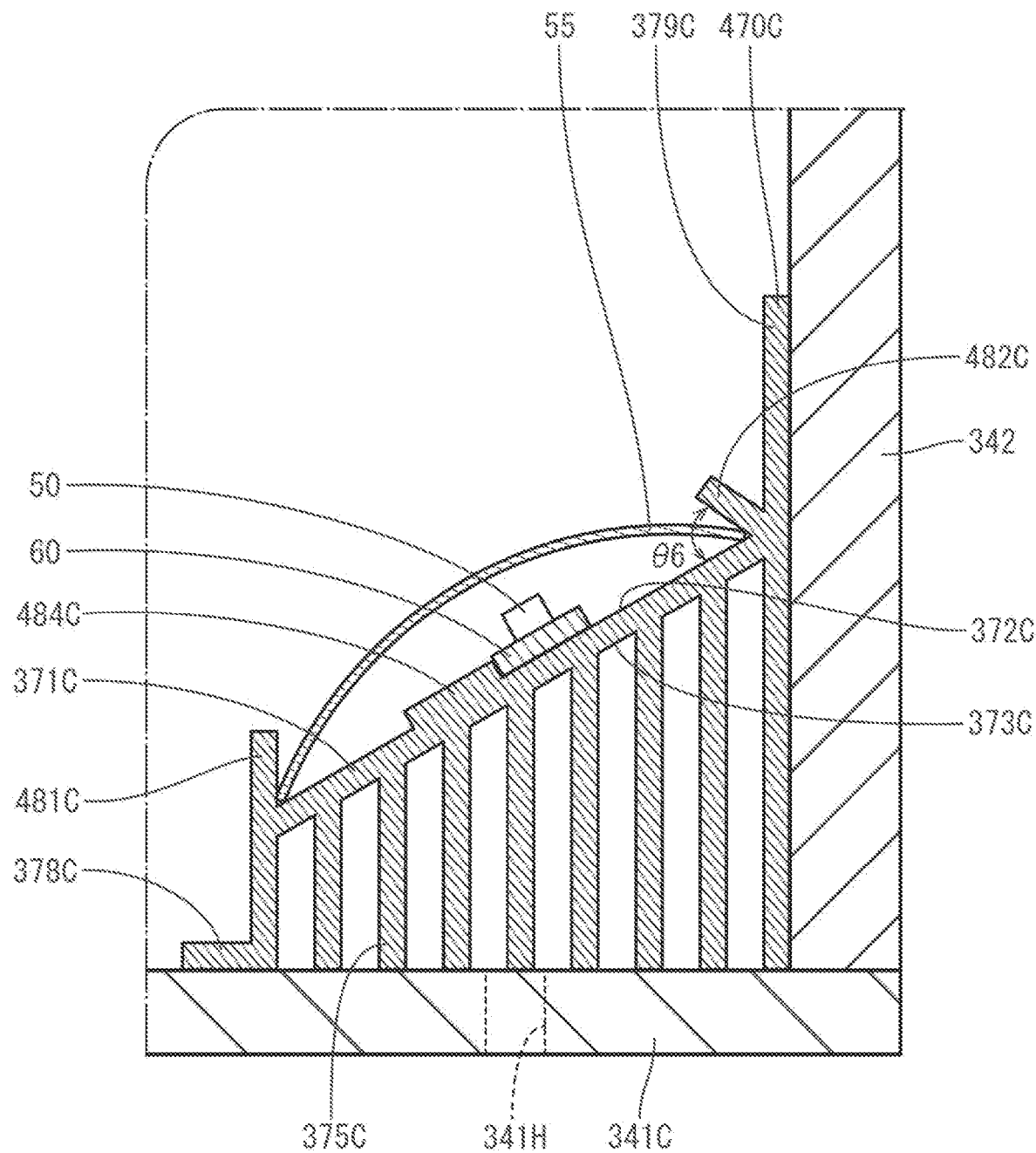
FIG. 27 is a magnified cross-sectional view including a right heatsink and therearound.

As illustrated in FIGS. 26 and 27, the right heatsink 470C includes two first protrusions 481C and 482C and a second protrusion 484C. The first protrusions 481C and 482C are located at ends (side edges) of the sloped portion 71C with respect to an inclining direction in which the sloped portion 371C inclines (a short direction), respectively. The first protrusions 481C and 482C protrude from the first plate surface 372C toward the back of the liquid crystal panel 10. An angle θ6 between each of the first protrusions 481C and 482C and the sloped portion 371C is an acute angle. One of the diffuser sheets, which is referred to as the diffuser sheet 55, is attached to the first protrusions 481C and 482C to cover the light emitting surfaces of the LEDs 50. The diffuser sheet 55 is easily attachable to the first protrusions 481C and 482C. Light rays from the LEDs 50 are diffused by the diffuser sheet and thus the liquid crystal panel 10 and the object J disposed behind the liquid crystal panel 10 are evenly illuminated.

As illustrated in FIGS. 26 and 27, the second protrusion 484C on the first plate surface 372C contacts one of the side surfaces of the LED board 60. With the second protrusion 484C, the LED board 60 can be positioned on the first plate surface 372C. According to the configuration, accuracy in mounting of the LEDs 50 improves and thus unevenness in illumination light from the LEDs 50 can be reduced.

Sixth Embodiment

Side heatsinks (a left heatsink and a right heatsink 570C) included in a sixth embodiment will be described. The heatsinks have the similar configurations and thus the right heatsink 570C will be described with reference to FIG. 28. The right heatsink 570C has the same configuration as that of the right heatsink 470C in the fifth embodiment except for first fixing portions 585C and 586C. Configurations, functions, operation, and effects similar to those of the fourth embodiment or the fifth embodiment will not be described.

Figure 28:
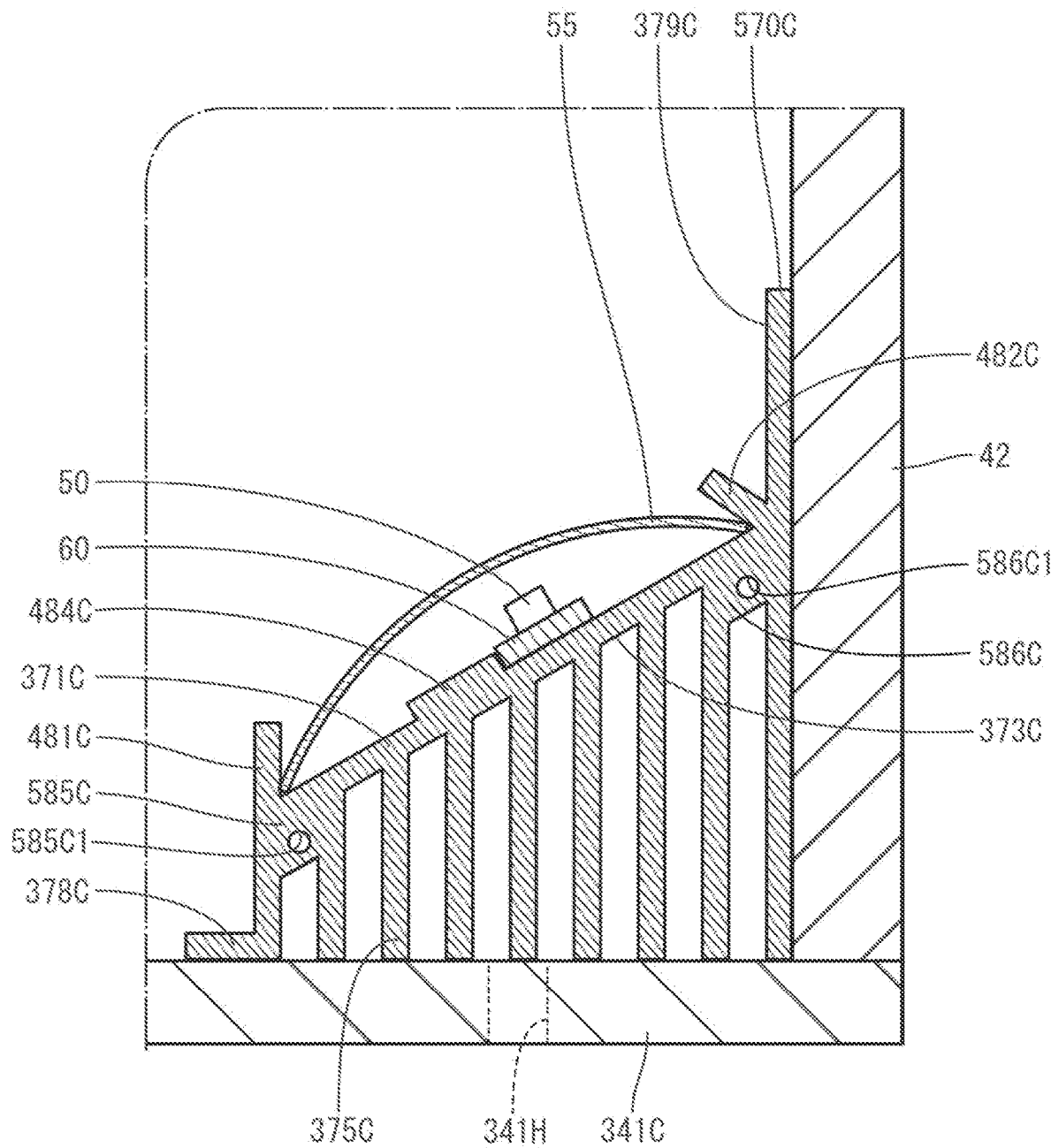
FIG. 28 is a magnified cross-sectional view including a right heatsink and therearound.

As illustrated in FIG. 28, the right heatsink 570C includes two first fixing portions 585C and 586C between the adjacent fins 375C and on the second plate surface 373C side.

The first fixing portions 585C and 586C include fixing holes 585C1 and 586C1, respectively. The right heatsink 570C is formed by extrusion molding. Therefore, the first fixing portions 585C and 586C and the fixing holes 585C1 and 586C1 are formed to extend in a longitudinal direction of the right heatsink 570C. The first fixing portions 585C and 586C include upper end sections in the longitudinal direction facing the top board 343 and lower end sections facing the shelf board 45. With the fixing holes 585C1 and 586C1, the upper end sections of the first fixing portions 585C and 586C are fixed to the top board 343 with screws (an example of fixing members) and the lower end portions of the first fixing portions 585C and 586C are fixed to the shelf board 45 with screws. The right heatsink 570C is stably fixed to the case 340.

Seventh Embodiment

Side heatsinks (a left heatsink and a right heatsink 670C) included in a seventh embodiment will be described. The heatsinks have similar configurations and thus the right heatsink 670C will be described with reference to FIG. 29. The right heatsink 670C has the same configuration as that of the right heatsink 570C in the sixth embodiment except for a second fixing portion 687C. Configurations, functions, operation, and effects similar to those of the fourth embodiment through the sixth embodiment will not be described.

Figure 29:
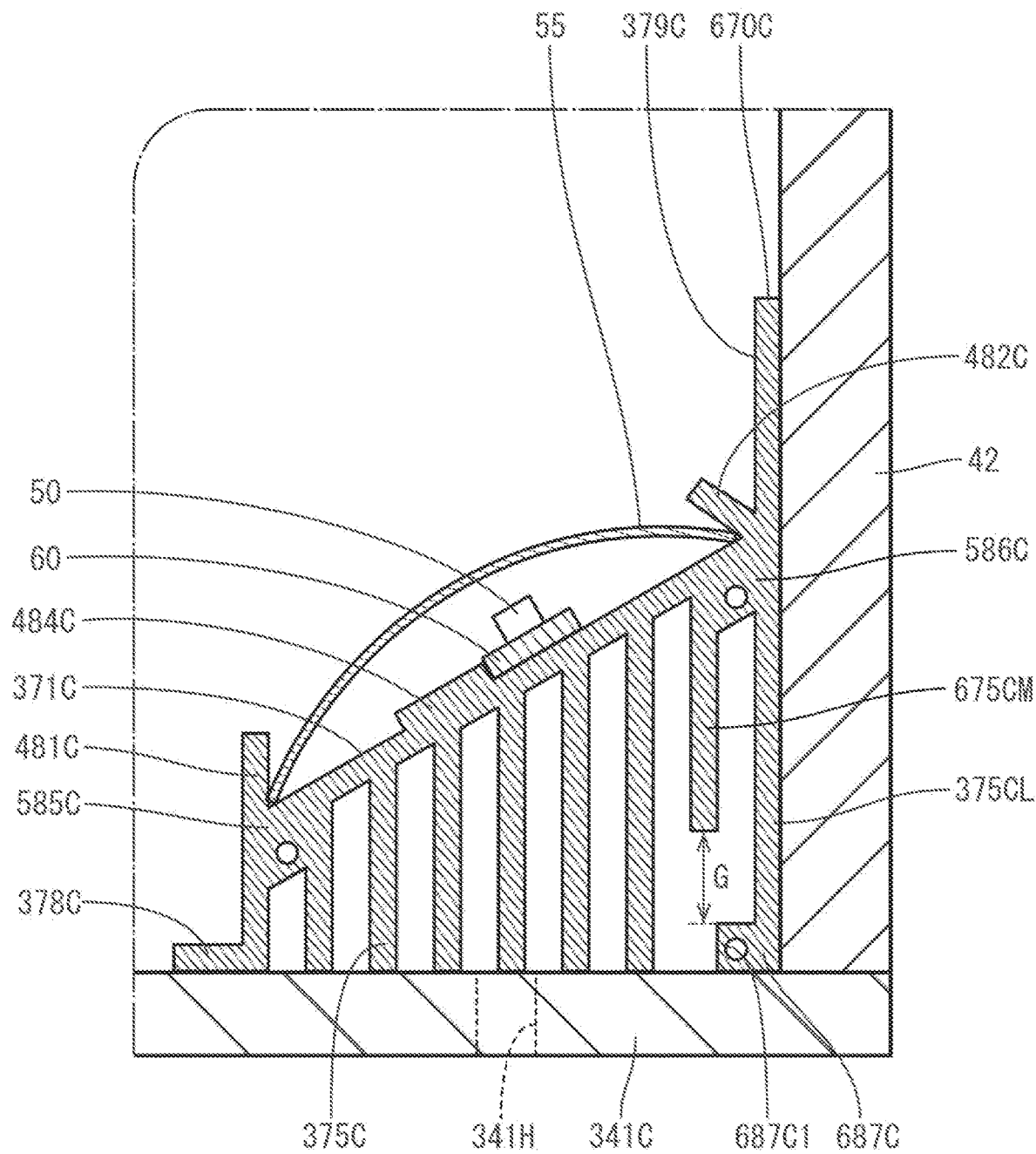
FIG. 29 is a magnified cross-sectional view of a right heatsink and therearound.

As illustrated in FIG. 29, the right heatsink 670C includes the second fixing portion 687C at a distal end of the long fin 375CL. The second fixing portion 687C includes a fixing hole 687C1. The second fixing portion 687C and the fixing hole 687C1 extend in a longitudinal direction of the right heatsink 670C. The second fixing portion 687C includes an upper end section in the longitudinal direction facing the top board 343 and a lower end section facing the shelf board 45. With the fixing hole 687C1, the upper end section of the second fixing portion 687C is fixed to the top board 343 with a screw and the lower end section of the second fixing portion 687C is fixed to the shelf board 45 with a screw. The right heatsink 670C is more stably fixed to the case 340.

As illustrated in FIG. 29, a fin 675CM adjacent to the long fin 375CL includes a distal end away from the second fixing portion 687C with a predefined gap G. According to the configuration, reduction in heat dissipation performance due to the second fixing portion 687C is less likely to occur.

Eighth Embodiment

Side heatsinks (a left heatsink and a right heatsink 770C) included in an eighth embodiment will be described. The heatsinks have similar configurations and thus one of the heatsinks on the right side, which will be referred to as the right heatsink 770C, will be described with reference to FIG. 15. The right heatsink 770C has the same configuration as that of the right heatsink 570C in the sixth embodiment except for a third fixing portion 788C. Configurations, functions, operation, and effects similar to those of the first through the seventh embodiments will not be described.

Figure 30:
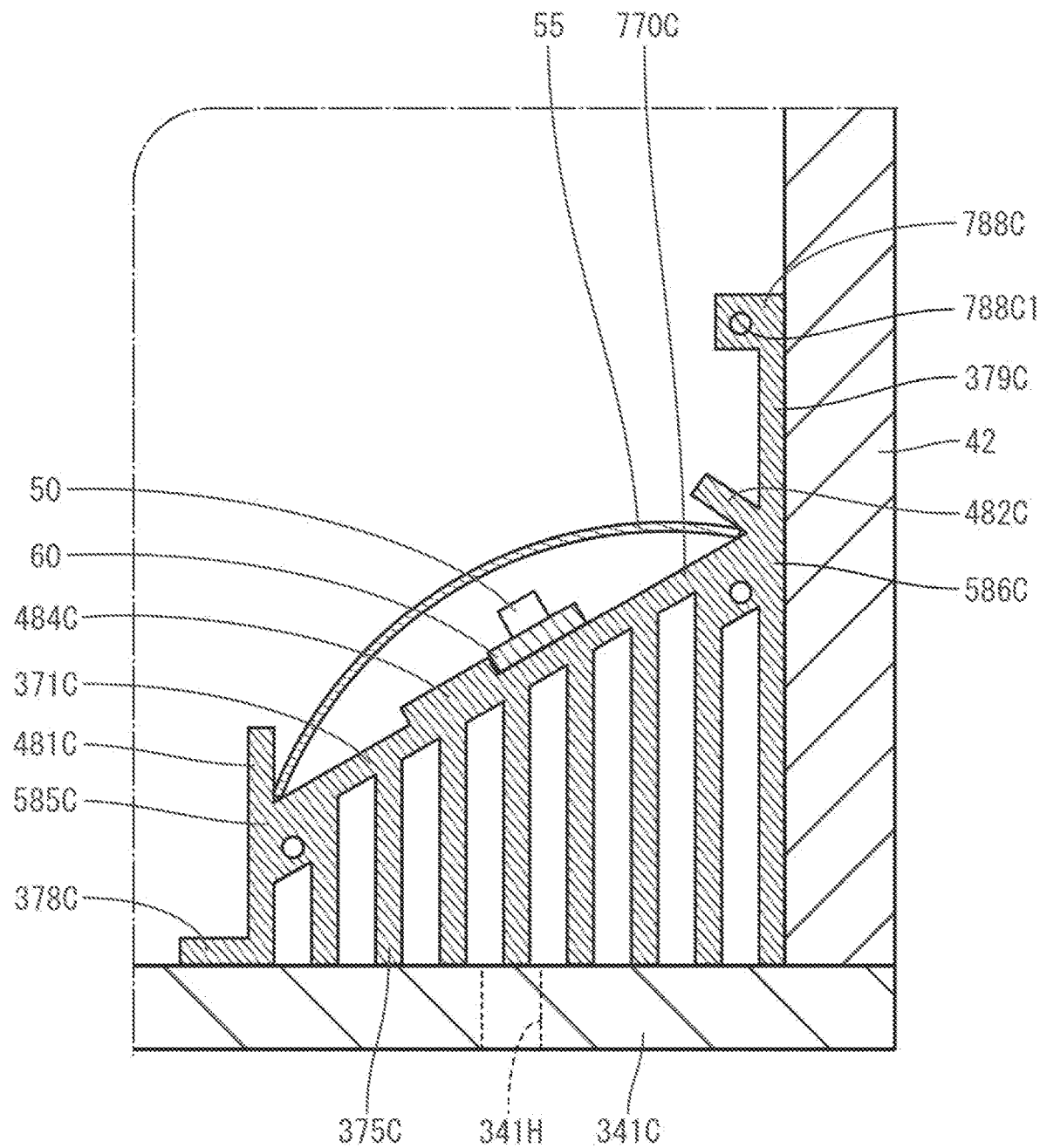
FIG. 30 is a magnified cross-sectional view of the right heatsink and therearound.

As illustrated in FIG. 30, the right heatsink 770C includes the third fixing portion 788C at a distal end of the second contact portion 379C. The third fixing portion 788C includes a fixing hole 788C1. The third fixing portion 788C and the fixing hole 788C1 extend in the longitudinal direction of the right heatsink 770C. The third fixing portion 788C includes an upper end section in the longitudinal direction facing the top board 43 and a lower end section facing the shelf board 45. With the fixing hole 788C1, the upper end section of the third fixing portion 788C is fixed to the top board 43 with a screw and the lower end section of the third fixing portion 788C is fixed to the shelf board 45. The right heatsink 770C is more stably fixed to the case 40.

Other Embodiments

The technology described herein is not limited to the embodiments described in this specification and illustrated in the drawings. For example, the following embodiments may be included in the technical scope of the present invention.

(1) The number and the intervals of the second fins 77C, 177C, and 277C are examples and may be altered where appropriate.

(2) The protrusion 81C may have a triangular cross section or a trapezoidal cross section.

(3) The contact surface 79C1 may not be attached with the adhesive member.

(4) The upper heatsinks may extend in the right-left direction for an entire area between two shelf boards 42.

(5) The case 40 or 340 may be made of resin or metal.

(6) The LED boards 60 may be disposed parallel to each other on the first sloped surfaces of the heatsinks 70A, 70B, and 70C. The substrates of the LED boards 60 may be made of an insulating material such as a synthetic resin.

(7) The shapes, the number, and the intervals of the LEDs 50 in the drawings are examples and may be altered where appropriate.

(8) The color filters may not be disposed on the substrate 20.

(9) The overall shape of the liquid crystal panel may be a vertically-long rectangular shape, a non-rectangular shape including curves, or other shapes. The size of the liquid crystal panel 10 may be other than the middle to large size.

(10) The number and the intervals of the fins of the heatsinks 370A, 370B, and 370C are examples and may be altered where appropriate.

(11) Each of the first protrusions 481C and 482C may have a triangular cross section or a trapezoidal cross section.

(12) The contact surfaces 378C1 and 379C1 may not be attached with the adhesive members.

(13) Each of the upper heatsinks may extend over an entire area between two side boards 42. In such a configuration, the first fixing portions 585C and 586C, the second fixing portion 687C, and the third fixing portion 788C may be included in the upper heatsink and the fixing portions may be fixed to the side boards 42.

(14) The shapes, the numbers, and the intervals of the ventilation holes 341H illustrated in the drawings are examples and thus may be altered where appropriate.

(15) The frame may not include the side boards 42, the bottom board 44, and the shelf board 45. The frame may be a partition including the frame portion 341 and the bottom board 44 or a member including the frame portion 341 hanging from a ceiling.

(16) The LED boards 60 may be disposed on the first plate surfaces of the heatsinks 370A, 370B, and 370C to be arranged parallel to each other. In such a configuration, second protrusions may be included in the LED boards 60 that are parallel to each other. The substrates of the LED boards 60 may be made of insulating material such as synthetic resin.

(17) The shapes, the number, and the intervals of the LEDs 50 illustrated in the drawings are example and thus may be altered where appropriate. The LEDs 50 may be side view type LEDs including side surfaces configured as light emitting surfaces. The angle θ5 at which the sloped portions of the heatsinks 370A, 370B, and 370C incline may be altered where appropriate according the light emitting surfaces.

What is claimed is:

1. A display device comprising:
a display panel being disposed in a vertical position and including a display surface on which an image is displayed; an upper light source, a left light source, and a right light source illuminating the display panel and an object disposed behind the display panel; and an upper heatsink to dissipate heat produced by the upper light source, the upper heatsink being disposed on an upper side of the display panel and including:
an upper light source disposed portion on which the upper light source is disposed; an upper heat dissipating portion disposed farther from a front of the display device relative to the upper light source disposed portions in a thickness direction of the display panel; and
fins having plate shapes and being arranged in the thickness direction of the display panel;
a left heatsink to dissipate heat produced by the left light source, the left heatsink being disposed on a left side of the display panel and including:
a left light source disposed portion on which the left light source is disposed;
a left heat dissipating portion disposed farther from the front of the display device relative to the left light source disposed portion in the thickness direction of the display panel;
and fins having plate shapes and being arranged in the thickness direction of the display panel; and a right heatsink to dissipate heat produced by the right light source, the right heatsink being disposed on a right side of the display panel and including:
a right light source disposed portion on which the right light source is disposed; a right heat dissipating portion disposed farther from the front of the display device relative to the right light source disposed portion in the thickness direction of the display panel; and fins having plate shapes and being arranged in the thickness direction of the display panel.

2. The display device according to claim 1, wherein each of the upper light source disposed portion, the left light source disposed portion, and the right light source disposed portion has a triangular cross section, each of the upper light source disposed portion, the left light source disposed portion, and the right light source disposed portion includes:
a first sloped surface that includes a sloped side of the triangular cross section;
a surface that is along a thickness direction of the display panel and includes a bottom side of the triangular cross section; and
a second sloped surface that includes another sloped side of the triangular cross section, the display device further comprises a reflecting member that reflects light from the upper light source, the left light source, and the right light source, and the reflecting member projects to an opposite side from the display surface.

3. The display device according to claim 1, wherein the fins of the upper heatsink, the left heatsink, and the right heatsink include plate surfaces having areas that are greater as distances from the upper light source disposed portion, the left light source disposed portion, and the right light source disposed portion increase, respectively.

4. The display device according to claim 1, wherein some of the fins of each of the upper heatsink, the left heatsink, and the right heatsink that include plate surfaces having areas less than a predefined limit and become larger as a distance from corresponding one of the upper light source disposed portion, the left light source disposed portion, and the right light source disposed portion increases, and some of the fins of each of the upper heatsink, the left heatsink, and the right heatsink that include plate surfaces having areas equal to or greater than the predefined limit and constant regardless of the distance from corresponding one of the upper light source disposed portion, the left light source disposed portion, and the right light source disposed portion.

5. The display device according to claim 1, wherein the fins of the upper heatsink, the left heatsink, and the right heatsink include plate surfaces having areas that are within a predefined limit.

6. The display device according to claim 1, wherein the fins of the upper heatsink, the left heatsink, and the right heatsink include plate surfaces that are angled relative to the display surface.

7. The display device according to claim 1, further comprising a frame including a frame portion that surround a display area of the display surface, wherein the upper heatsink, the left heatsink, and the right heatsink are attached to the frame portion.

8. The display device according to claim 1, wherein each of the upper heatsink, the left heatsink, and the right heatsink includes:
  a sloped portion having a plate shape inclined at a predefined angle relative to a horizontal direction of the display surface and including a first plate surface farther from the front of the display device in a thickness direction of the display panel and on which corresponding one of the upper light source, the left light source, and the right light source is disposed, and fins protruding from a second plate surface of the sloped portion adjacent to
the display surface in the thickness direction of the display panel, the fins are arranged along the horizontal direction of the display surface, and the fins have dimensions in a protruding direction in which the fins of corresponding one of the upper heatsink, the left heatsink, and the right heatsink protrude becoming greater as a distance from the display panel increases.

9. The display device according to claim 1, wherein the display panel has transparency so that the object is viewed through the display panel, and the display panel display the image so that the image is superimpose over the object.

10. The display device according to claim 2, further comprising a protrusion protruding from the second sloped surface to position the reflecting member.

11. The display device according to claim 7, wherein the frame includes an extending portion extending from an outer edge of the frame portion to project rearward in a thickness direction of the display panel, and the upper heatsink, the left heatsink, and the right heatsink include contact portions that contact the extending portion.

12. The display device according to claim 8, wherein a the upper heatsink, the left heatsink, and the right heatsink include first plate surfaces farther from the front of the display device in the thickness direction of the display panel and second plate surfaces closer to the front of the display device than the first plate surfaces, the upper light source, the left light source, and the right light source are disposed on the first plate surfaces of the upper heatsink, the left heatsink, and the right heatsink, respectively.

13. The display device according to claim 8, wherein each of the upper heatsink, the left heatsink, and the right heatsink includes protrusions at ends of the sloped portion with respect to an inclining direction in which the sloped portion inclines, and the display device further comprises an optical member having a diffusing ability and being attached to the protrusions.

14. The display device according to claim 8, wherein the upper light source, the left light source, and the right light source includes LEDs, the display device further comprises LED boards on which the LEDs are mounted, the LED boards are disposed on the first plate surfaces, and the upper heatsink, the left heatsink, and the right heatsink include second protrusions that protrude from the first plate surfaces to contact side surfaces of the LED boards.

15. The display device according to claim 8, further comprising a frame including a frame portion surrounding a display area of the display surface, wherein the upper heatsink, the left heatsink, and the right heatsink are attached to the frame.

16. The display device according to claim 11, wherein each of the contact portions has a plate shape, the contact portions include first plate surfaces that contacts the extending portion and second plate surfaces on which the upper light source disposed portion, the left light source disposed portion, the right light source disposed portion, the upper heat dissipating portion, the right heat dissipating portion, and the left heat dissipating portion are disposed, respectively.

17. The display device according to claim 15, wherein each of the upper heatsink, the left heatsink, and the right heatsink includes a first fixing portion between the fins of corresponding one of the upper heatsink, the left heatsink, and the right heatsink that are adjacent to each other to fix the corresponding one of the upper heatsink, the left heatsink, and the right heatsink to the frame, and
  the first fixing portion includes a fixing hole in which a fixing member is insertable.

18. The display device according to claim 15, wherein one of the fins, a dimension between the second plate surface and a distal end thereof is the greatest, is defined as a long fin, the distal end of the long fin includes a second fixing portion to fix the corresponding one of the upper heatsink, the left heatsink, and the right heatsink to the frame, and the second fixing portion includes a fixing hole in which a fixing member is insertable.

19. The display device according to claim 18, wherein one of the fins of the corresponding one of the upper heatsink, the left heatsink, and the right heatsink adjacent to the long fin includes a distal end that is a predefined distance away from the second fixing portion.

* * * * *